(12) United States Patent
Vimercati

(10) Patent No.: US 10,692,564 B2
(45) Date of Patent: Jun. 23, 2020

(54) MEMORY CELL SENSING BASED ON PRECHARGING AN ACCESS LINE USING A SENSE AMPLIFIER

(71) Applicant: Micron Technology, Inc., Boise, ID (US)

(72) Inventor: Daniele Vimercati, El Dorado Hills, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/701,028

(22) Filed: Dec. 2, 2019

(65) Prior Publication Data

US 2020/0118613 A1    Apr. 16, 2020

Related U.S. Application Data

(63) Continuation of application No. 16/156,347, filed on Oct. 10, 2018, now Pat. No. 10,546,629.

(51) Int. Cl.
| | |
|---|---|
| *G11C 11/40* | (2006.01) |
| *G11C 11/4091* | (2006.01) |
| *G11C 11/22* | (2006.01) |
| *G11C 11/408* | (2006.01) |

(52) U.S. Cl.
CPC ........ *G11C 11/4091* (2013.01); *G11C 11/221* (2013.01); *G11C 11/2257* (2013.01); *G11C 11/2273* (2013.01); *G11C 11/4085* (2013.01)

(58) Field of Classification Search
CPC .............. G11C 11/4091; G11C 11/221; G11C 11/2273
See application file for complete search history.

(56) References Cited

U.S. PATENT DOCUMENTS

| | | | |
|---|---|---|---|
| 6,538,914 B1 * | 3/2003 | Chung | G11C 11/22 365/145 |
| 2004/0006441 A1 | 1/2004 | Rickes et al. | |
| 2005/0018470 A1 * | 1/2005 | Jung | G11C 7/062 365/149 |
| 2011/0090745 A1 | 4/2011 | La | |
| 2015/0155014 A1 | 6/2015 | Giridhar et al. | |
| 2016/0125939 A1 | 5/2016 | Park et al. | |
| 2016/0358648 A1 | 12/2016 | Park et al. | |

* cited by examiner

*Primary Examiner* — Han Yang
(74) *Attorney, Agent, or Firm* — Holland & Hart LLP

(57) ABSTRACT

Methods, systems, and devices for operating a memory device are described. A sense amplifier may be used to precharge an access line to increase the reliability of the sensing operation. The access line may then charge share with the memory cell and a capacitor, which may be a reference capacitor, which may result in high-level states and low-level states on the access line. By precharging the access line with the sense amplifier and implementing charge sharing between the access line and a capacitor, the resulting high-level state and the low-level states on the access line may account for any offset voltage associated with the sense amplifier.

20 Claims, 15 Drawing Sheets

MEMORY CELL SENSING BASED ON PRECHARGING AN ACCESS LINE USING A SENSE AMPLIFIER

CROSS REFERENCE

The present Application for Patent is a divisional of and claims priority to and the benefit of U.S. patent application Ser. No. 16/156,347 by Vimercati, entitled "MEMORY CELL SENSING BASED ON PRECHARGING AN ACCESS LINE USING A SENSE AMPLIFIER," filed Oct. 10, 2018, assigned to the assignee hereof, and which is expressly incorporated by reference in its entirety herein.

BACKGROUND

The following relates generally to operating a memory device, and more specifically to memory cell sensing based on precharging an access line using a sense amplifier.

Memory devices are widely used to store information in various electronic devices such as computers, wireless communication devices, cameras, digital displays, and the like. Information is stored by programing different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including those that employ magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, such as PCM and FeRAM, may maintain stored logic states for extended periods of time even in the absence of an external power source. Volatile memory devices, such as DRAM, may lose stored logic states over time unless they are periodically refreshed by a power source. In some cases, non-volatile memory may use similar device architectures as volatile memory but may have non-volatile properties by employing such physical phenomena as ferroelectric capacitance or different material phases.

Improving memory devices, generally, may include increasing memory cell density, increasing read/write speeds, increasing reliability, increasing data retention, reducing power consumption, or reducing manufacturing costs, among other metrics. Sensing the stored state of a memory cell with increased accuracy may be desirable. For example, increased sensing accuracy may provide increased reliability during a read operation.

DETAILED DESCRIPTION

Figure 1:
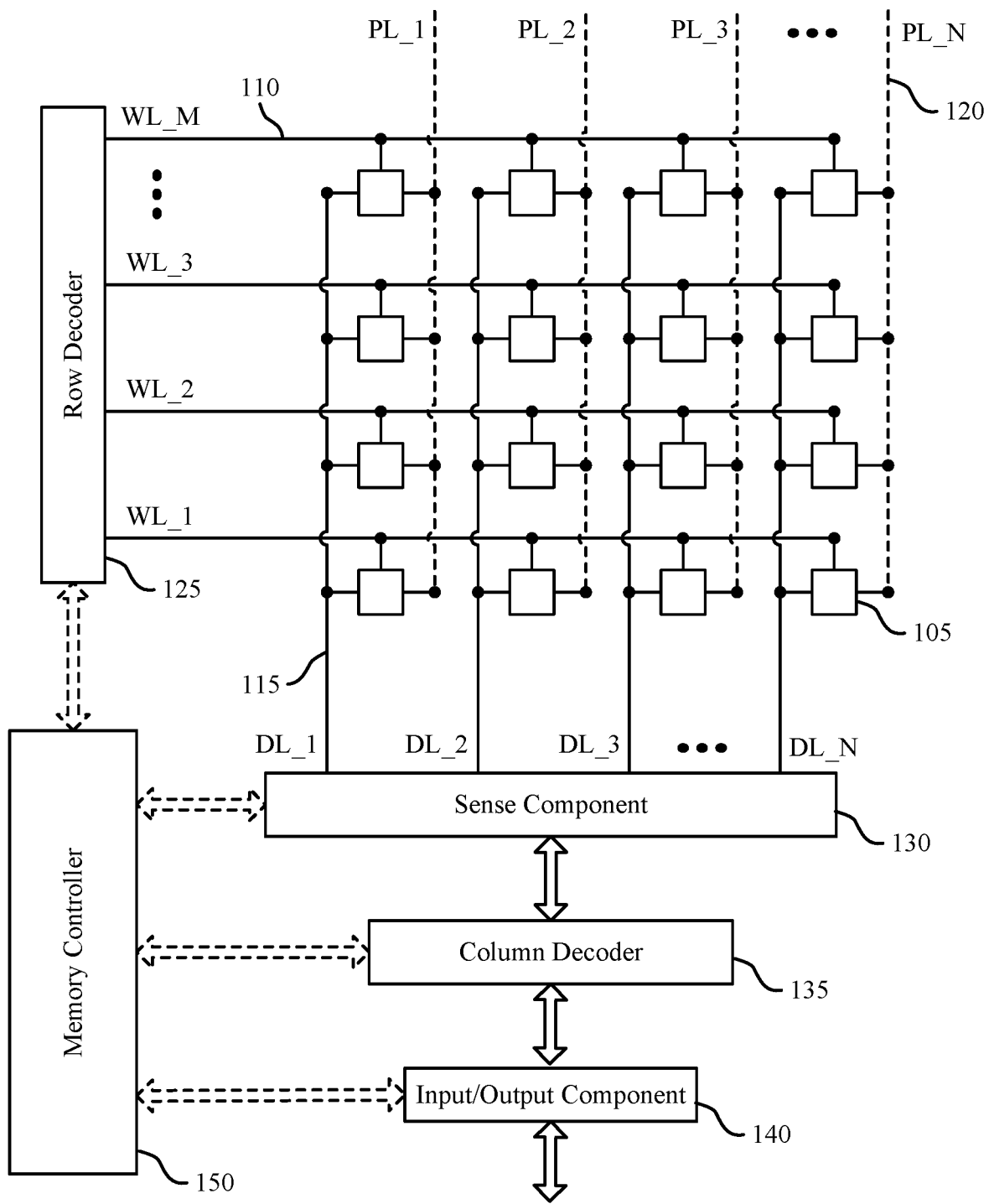
FIG. 1 illustrates an example of a system for operating a memory device that supports memory cell sensing based on precharging an access line using a sense amplifier in accordance with aspects of the present disclosure.

The logic state of a memory cell may be detected using a read or sense operation that employs memory cell sensing based on precharging an access line using a sense amplifier in accordance with aspects of the present disclosure. In some sensing schemes, a first component such as a charge transfer device or the like may be used to precharge an access line while a second component may be used for the sensing operation. One or both of the first component used for precharging and the second sensing component may have offset voltages (e.g., variations in operating parameters such as threshold voltages due to process variations in fabrication, due to operating conditions, or due to any other imperfection or undesired characteristic). In the example that the sensing component has an offset voltage, this offset voltage may natively reside on the sensing component. The offset voltage of the sensing component may introduce inaccuracies into the sensing operation, by unintentionally shifting the sensed state in an unaccounted-for direction. The offset voltage may vary from component to component, based on environmental factors, or based on other factors, and thus it may be difficult to mitigate or otherwise account for the effects of the offset voltage of a given sensing component.

As discussed herein, the accuracy of the sensing operation may be improved by using a single device to precharge the access line and to also sense the state of the memory cell. By using the same device to precharge the access line and sense the memory cell state, any offset voltage of the precharging/sensing device may impact (e.g., be inherently present in) both precharging and sensing, which may effectively nullify or cancel out the offset voltage when the device senses the memory cell state, thus increasing the accuracy of the sensing operation.

In one example, a memory device may include an amplifier component coupled with or between a memory cell and a latch. The amplifier component may be, in some cases, a differential amplifier. In this example, the access line may be precharged to a first voltage by coupling the access line with an amplifier component. The first voltage may be based at least on a target voltage, which in some cases, may be zero, and an offset voltage which may be an inherent voltage that resides on or otherwise impacts the operation of the amplifier component. After precharging, charge may be transferred between the access line and the memory cell. The access line may transition from the first voltage to a second voltage. Another charge transfer operation, which may happen subsequent to or contemporaneously with the first charge transfer operation, may transfer charge between the access line and a capacitor. The access line may transition from the second voltage to a third voltage based on this second charge transfer operation. Last, a state of the memory cell may be determined based on amplifying the third voltage using the amplifier component.

In another example, the amplifier component may be, in some cases, a folded cascode amplifier. In this example, the access line may be set to an initial voltage that may be greater than a first voltage. The access line may be precharged to the first voltage by coupling the access line with an amplifier component (e.g., the access line may discharge through the amplifier component). Then, similar to the differential amplifier operation, charge may be transferred between the access line and the memory cell. The access line may transition from the first voltage to a second voltage. Another charge transfer operation, which may happen subsequent to or contemporaneously with the first charge transfer operation, may transfer charge between the access line and a capacitor. The access line may transition from the second voltage to a third voltage based on this second charge transfer operation. Last, a state of the memory cell may be determined based on amplifying the third voltage using the amplifier component.

Techniques are provided sensing the stored state of a memory cell based on precharging an access line of the memory cell using a same device that determines the stored state (e.g., precharging using a sense amplifier). Sensing a memory cell capable of storing one or more states may be improved by implementing a sense amplifier. The sense amplifier may be used to precharge an access line to increase the reliability of the sensing operation. The access line may then charge share with the memory cell, which may result in high-level states and low-level states on the access line. Next, by precharging the access line with the sense amplifier and implementing charge sharing between the access line and a capacitor, which may be a reference capacitor, the high-level state and the low-level state on the access line may shift so that the two levels may be approximately centered around the precharge value on the access line.

Features of the disclosure are initially described in the context of a memory system. Features of the disclosure are described in the context of a circuit, memory die, a memory system, and a timing diagram that support memory cell sensing based on precharging an access line using a sense amplifier in accordance with aspects of the present disclosure. These and other features of the disclosure are further illustrated by and described with reference to apparatus diagrams, system diagrams, and flowcharts that relate to memory cell sensing based on precharging an access line using a sense amplifier.

FIG. 1 illustrates an example memory device 100 that may support memory cell sensing based on precharging an access line using a sense amplifier in accordance with various embodiments of the present disclosure. Memory device 100 may also be referred to as an electronic memory apparatus. Memory device 100 includes memory cells 105 that are programmable to store different logic states. In some cases, a memory cell 105 may be programmable to store two logic states, denoted a logic 0 and a logic 1. In some cases, a memory cell 105 may be programmable to store more than two logic states.

In some examples, a memory cell 105 may store an electrical charge representative of the programmable logic states in a capacitive memory element. For example, a charged and uncharged capacitor of a memory cell 105 may represent two logic states, respectively, or a positively charged and a negatively charged capacitor of a memory cell 105 may represent two logic states, respectively. DRAM architectures may commonly use such a design, and the capacitor employed may include a dielectric material with linear or para-electric electric polarization properties as the insulator. In some examples, such as FeRAM architectures, a memory cell 105 may include a ferroelectric capacitor having a ferroelectric material as an insulating layer between terminals of the capacitor. Different levels of polarization of a ferroelectric capacitor may represent different logic states (e.g., supporting two or more logic states in a respective memory cell 105). Ferroelectric materials have non-linear polarization properties including those discussed in further detail with reference to FIG. 3.

In some examples, a memory cell 105 may include a material portion, which may be referred to as a memory element, a memory storage element, a self-selecting memory element, or a self-selecting memory storage element. The material portion may have a variable and configurable electrical resistance that is representative of different logic states.

For example, a material that can take the form of a crystalline atomic configuration or an amorphous atomic configuration (e.g., able to maintain either a crystalline state or an amorphous state over an ambient operating temperature range of the memory device 100) may have different electrical resistances depending on the atomic configuration. A more-crystalline state of the material (e.g., a single crystal, a collection of a relatively large crystal grains that is substantially crystalline) may have a relatively low electrical resistance, and may alternatively be referred to as a "SET" logic state. A more-amorphous state of the material (e.g., an entirely amorphous state, some distribution of relatively small crystal grains that is substantially amorphous) may have a relatively high electrical resistance, and may alternatively be referred to as a "RESET" logic state. Thus, a voltage applied to such a memory cell 105 may result in different current flow depending on whether the material portion of the memory cell 105 is in the more-crystalline or the more-amorphous state. Accordingly, the magnitude of the current resulting from applying a read voltage to the memory cell 105 may be used to determine a logic state stored by memory cell 105.

In some examples, a memory element may be configured with various ratios of crystalline and amorphous areas (e.g., varying degrees of atomic order and disorder) that may result in intermediate resistances, which may represent different logic states (e.g., supporting two or more logic states in a respective memory cell 105). Further, in some examples, a material or a memory element may have more than two atomic configurations, such as an amorphous configuration and two different crystalline configurations. Although described herein with reference to an electrical resistance of different atomic configurations, a memory device may use some other characteristic of a memory element to determine a stored logic state corresponding to an atomic configuration, or combination of atomic configurations.

In some cases, a memory element in a more-amorphous state may be associated with a threshold voltage, where electrical current flows through the memory element when the threshold voltage is exceeded across the memory element. When a voltage applied across the memory element in the more-amorphous state is less than the threshold voltage, current may not flow through the memory element. In some cases, a memory element in the more-crystalline state may not be associated with a threshold voltage (e.g., may be associated with a threshold voltage of zero), and a current may flow through the memory element in response to a non-zero voltage across the memory element. In some cases, a material in both the more-amorphous state and the more-crystalline state may be associated with threshold voltages. For example, self-selecting memory may enhance differences in a threshold voltage of the memory cell between different programmed states (e.g., by way of different compositional distributions). The logic state of a memory cell 105 having such a memory element may be set by heating the memory element to a temperature profile over time that supports forming a particular atomic configuration, or combination of atomic configurations.

Memory device 100 may include a three-dimensional (3D) memory array, where a plurality of two-dimensional (2D) memory arrays (e.g., decks) are formed on top of one another. This may increase the number of memory cells 105 that may be placed or created on a single die or substrate as compared with 2D arrays, which in turn may reduce production costs or increase the performance of the memory device 100, or both. The decks may be separated by an electrically insulating material. Each deck may be aligned or positioned so that memory cells 105 may be approximately aligned with one another across each deck, forming a stack of memory cells 105.

According to the example of FIG. 1, each row of memory cells 105 is coupled with one of a plurality of first access lines 110 (e.g., a word line (WL)), and each column of memory cells 105 is coupled with one of a plurality of second access lines 115 (e.g., a digit line (DL)). Thus, one memory cell 105 may be located at the intersection of one of the first access lines 110 and one of the second access lines 115. This intersection may be referred to as an address of the memory cell 105. References to word lines and bit lines, or their analogues, are interchangeable without loss of understanding or operation. In some cases, first access lines 110 and second access lines 115 may be substantially perpendicular to one another in the memory device 100 (e.g., when viewing a plane of a deck of the memory device 100, as shown in FIG. 1). References to word lines and bit lines, or their analogues, are interchangeable without loss of understanding or operation.

In general, one memory cell 105 may be located at the intersection of (e.g., coupled with, coupled between) an access line 110 and an access line 115. This intersection may be referred to as an address of a memory cell 105. A target memory cell 105 may be a memory cell 105 located at the intersection of an energized or otherwise selected access line 110 and an energized or otherwise selected access line 115. In other words, an access line 110 and an access line 115 may be energized or otherwise selected to access (e.g., read, write) a memory cell 105 at their intersection. Other memory cells 105 that are in electronic communication with (e.g., connected to) the same access line 110 or 115 may be referred to as untargeted memory cells 105.

Although the access lines described with reference to FIG. 1 are shown as direct lines between memory cells 105 and coupled components, access lines may include other circuit elements, such as capacitors, resistors, transistors, amplifiers, voltage sources, switching components, selection components, and others, which may be used to support access operations including those described herein. In some examples, an electrode may be coupled with (e.g., between) a memory cell 105 and an access line 110, or with (e.g., between) a memory cell 105 and an access line 115. The term electrode may refer to an electrical conductor, or other electrical interface between components, and in some cases, may be employed as an electrical contact to a memory cell 105. An electrode may include a trace, wire, conductive line, conductive layer, conductive pad, or the like, that provides a conductive path between elements or components of memory device 100.

In some architectures, the logic storing component (e.g., a capacitive memory element) of a memory cell 105 may be electrically isolated from a second access line 115 by a selection component. A first access line 110 may be coupled with and may control the selection component. For example, the selection component may be a transistor and the first access line 110 may be coupled with a gate of the transistor. Activating the first access line 110 may result in an electrical connection or closed circuit between the logic storing component of the memory cell 105 and its corresponding second access line 115. The second access line 115 may then be accessed to read and/or write the memory cell 105.

In some examples, memory cells 105 may also be coupled with one of a plurality of third access lines 120 (e.g., a plate line (PL)). In some examples, the plurality of third access lines may couple memory cells 105 with a voltage source for various sensing and/or writing operations including those described herein. For example, when memory cells 105 employ a capacitor for storing a logic state, a second access line 115 may provide access to a first terminal of the capacitor, and a third access line 120 may provide access to a second terminal of the capacitor. As used herein, the term "terminal" need not suggest a physical boundary or connection point of a capacitor of a memory cell 105. Rather, "terminal" may refer to a reference point of a circuit relevant to the capacitor of the memory cell, which may also be referred to as a "node" or "reference point." Although the plurality of third access lines 120 of the memory device 100 are shown as substantially parallel with the plurality of second access lines 115, in other examples a plurality of third access lines 120 may be substantially parallel with the plurality of first access lines 110, or in any other configuration.

Access operations such as reading, writing, and rewriting may be performed on a memory cell 105 by activating or selecting a first access line 110, a second access line 115, and/or a third access line 120 coupled with the memory cell 105, which may include applying a voltage, a charge, and/or a current to the respective access line. Access lines 110, 115, and 120 may be made of conductive materials, such as metals (e.g., copper (Cu), silver (Ag), aluminum (Al), gold (Au), tungsten (W), titanium (Ti), etc.), metal alloys, carbon, or other conductive materials, alloys, or compounds. Upon selecting a memory cell 105, a resulting signal may be used to determine the stored logic state. For example, a memory cell 105 with a capacitive memory element storing a logic state may be selected, and the resulting flow of charge via an access line and/or resulting voltage of an access line may be detected to determine the programmed logic state of the memory cell 105.

Accessing memory cells 105 may be controlled through a row decoder 125 and a column decoder 135. For example, a row decoder 125 may receive a row address from the memory controller 150 and activate the appropriate first access line 110 based on the received row address. Similarly, a column decoder 135 may receive a column address from the memory controller 150 and activate the appropriate second access line 115. Thus, in some examples a memory cell 105 may be accessed by activating a first access line 110 and a second access line 115.

In some examples, the memory controller 150 may control the operation (e.g., read operations, write operations, rewrite operations, refresh operations, discharge operations) of memory cells 105 through the various components (e.g., row decoder 125, column decoder 135, sense component 130). In some cases, one or more of the row decoder 125, column decoder 135, and sense component 130 may be co-located or otherwise included with the memory controller 150. The memory controller 150 may generate row and column address signals to activate a desired access line 110 and access line 115. The memory controller 150 may also generate or control various voltages or currents used during the operation of memory device 100. For example, the memory controller 150 may apply a discharge voltage to an access line 110 or an access line 115 after accessing one or more memory cells 105.

In general, the amplitude, shape, or duration of an applied voltage, current, or charge may be adjusted or varied, and may be different for the various operations discussed in operating the memory device 100. Further, one, multiple, or all memory cells 105 within memory device 100 may be accessed simultaneously. For example, multiple or all memory cells 105 of memory device 100 may be accessed simultaneously during a reset operation in which all memory cells 105, or a group of memory cells 105, are set to a single logic state.

A memory cell 105 may be read, or sensed, by a sense component 130. For example, sense component 130 may be configured to determine the stored logic state of a memory cell 105 based on a signal generated by accessing the memory cell 105. The signal may include a voltage, an electrical charge, an electrical current, or a combination thereof, and sense component 130 may include voltage sense amplifiers, charge sense amplifiers, current sense amplifiers, or both. For example, a voltage may be applied to a memory cell 105 having a capacitive memory element (e.g., using the corresponding first access line 110, second access line 115, and/or third access line 120), and a magnitude of the resulting flow of charge and/or voltage may depend on the stored charge and/or polarization of the capacitive memory element. In some examples, the device memory controller 150 may be configured to control the operations of a memory array as it relates to a charge transfer operation. For example, each memory cell of memory array may be coupled with a sense component via a respective digit line. In some examples, the digit line may be coupled with a charge transfer device configured to transfer a charge between the digit line and the sense component based on a memory cell being discharged onto the digit line.

In some examples, after accessing the memory cell 105, the logic storage portion of memory cell 105 may discharge, or otherwise permit electrical charge or current to flow via its corresponding access line 115. Such charge or current may result from biasing, or applying a voltage, to the memory cell 105 from one or more voltage sources or supplies (not shown) of the memory device 100, where such voltage sources or supplies may be part of the sense component 130, the memory controller 150, or some other component (e.g., a biasing component). In some examples, a discharge of a memory cell 105 may cause a change in the voltage of the access line 115, which the sense component 130 may compare to a reference voltage to determine the stored state of the memory cell 105. In some examples, a voltage may be applied to a memory cell 105 (e.g., using the corresponding access line 110 and access line 115) and the presence of a resulting current may depend on the applied voltage and the resistance state of a memory element of the memory cell 105, which the sense component 130 may use to determine the stored state of the memory cell 105

In some examples, when a read pulse (e.g., a read voltage) is applied across a memory cell 105 with a memory element storing a first logic state (e.g., a SET state, associated with a more-crystalline atomic configuration), the memory cell conducts current due to the read pulse exceeding a threshold voltage of the memory cell 105. In response or based on this, the sense component 130 may therefore detect a current through the memory cell 105 as part of determining the stored logic state. When a read pulse is applied to the memory cell 105 with the memory element storing a second logic state (e.g., a RESET state, associated with an more-amorphous atomic configuration), which may occur before or after the application of a read pulse across a memory cell 105 with a memory element storing a first logic state, the memory cell 105 may not conduct current due to the read pulse not exceeding the threshold voltage of the memory cell. The sense component 130 may therefore detect little or no current through the memory cell 105 as part of determining the stored logic state.

In some examples, a threshold current may be defined for sensing the logic state stored by a memory cell 105. The threshold current may be set above a current that may pass through the memory cell 105 when the memory cell 105 does not threshold in response to the read pulse, but equal to or below an expected current through the memory cell 105 when the memory cell 105 does threshold in response to the read pulse. For example, the threshold current may be higher than a leakage current of the associated access lines 110 or 115. In some examples, a logic state stored by a memory cell 105 may be determined based on a voltage (e.g., across a shunt resistance) resulting from the current driven by a read pulse. For example, the resulting voltage may be compared relative to a reference voltage, with a resulting voltage less than the reference voltage corresponding to a first logic state and a resulting voltage greater than the reference voltage corresponding to a second logic state.

In some examples, more than one voltage may be applied when reading a memory cell 105 (e.g., multiple voltages may be applied as part of a read operation). For example, if an applied read voltage does not result in current flow, one or more other read voltages may be applied (e.g., until a current is detected by sense component 130). Based on assessing the read voltage that resulted in current flow, the stored logic state of the memory cell 105 may be determined. In some cases, a read voltage may be ramped (e.g., smoothly increasing higher in magnitude) until a current flow or other condition is detected by a sense component 130. In other cases, predetermined read voltages may be applied (e.g., a predetermined sequence of read voltages that increase higher in magnitude in a stepwise manner) until a current is detected. Likewise, a read current may be applied to a memory cell 105 and the magnitude of the voltage to create the read current may depend on the electrical resistance or the total threshold voltage of the memory cell 105.

A sense component 130 may include various switching components, selection components, transistors, amplifiers, capacitors, resistors, or voltage sources to detect and amplify a difference in sensing signals (e.g., a difference between a read voltage and a reference voltage, a difference between a read current and a reference current, a difference between a read charge and a reference charge), aspects of which, in some examples, may be referred to as latching. In some examples, a sense component 130 may include a collection of components (e.g., circuit elements) that may be repeated for each of a set of access lines 115 connected to the sense component 130. For example, a sense component 130 may include a separate sensing circuit (e.g., a separate sense amplifier, a separate signal development circuit) for each of a set of access lines 115 coupled with the sense component 130, such that a logic state may be separately detected for a respective memory cell 105 coupled with a respective one of the set of access lines 115. In various examples, a reference signal source or generated reference signal may be shared between components of the memory device 100 (e.g., shared among one or more sense components 130, shared among separate sensing circuits of a sense component 130).

The sense component 130 may be included in a device that includes the memory device 100. For example, the sense component 130 may be included with other read and write circuits, decoding circuits, or register circuits of the memory that may be coupled to the memory device 100. In some examples, the detected logic state of a memory cell 105 may be output through a column decoder 135 as an output. In some examples, a sense component 130 may be part of a column decoder 135 or a row decoder 125. In some examples, a sense component 130 may be connected to or otherwise in electronic communication with a column decoder 135 or a row decoder 125.

Although a single sense component 130 is shown, a memory device 100 may include more than one sense component 130. For example, a first sense component 130 may be coupled with a first subset of access lines 115 and a second sense component 130 may be coupled with a second subset of access lines 115 (e.g., different from the first subset of access lines 115). In some examples, such a division of sense components 130 may support parallel (e.g., simultaneous) operation of multiple sense components 130. In some examples, such a division of sense components 130 may support matching sense components 130 having different configurations or characteristics to particular subsets of the memory cells 105 of the memory device (e.g., supporting different types of memory cells 105, supporting different characteristics of subsets of memory cells 105, supporting different characteristics of subsets of access lines 115). Additionally or alternatively, two or more sense components 130 may be coupled with a same set of access lines 115 (e.g., for component redundancy). In some examples, such a configuration may support maintaining functionality to overcome a failure or otherwise poor operation of one of the redundant sense components 130. In some examples, such a configuration may support the ability to select one of the redundant sense components 130 for particular operational characteristics (e.g., as related to power consumption characteristics, as related to access speed characteristics for a particular sensing operation).

In some memory architectures, accessing the memory cell 105 may degrade or destroy the stored logic state and re-write or refresh operations may be performed to return the original logic state to memory cell 105. In DRAM or FeRAM, for example, a capacitor of a memory cell 105 may be partially or completely discharged during a sense operation, thereby corrupting the logic state that was stored in the memory cell 105. In PCM, for example, sense operations may cause a change in the atomic configuration of a memory cell 105, thereby changing the resistance state of the memory cell 105. Thus, in some examples, the logic state stored in a memory cell 105 may be rewritten after an access operation. Further, activating a single access line 110 or 115 may result in the discharge of all memory cells 105 coupled with the access line 110 or 115. Thus, several or all memory cells 105 coupled with an access line 110 or 115 of an access operation (e.g., all cells of an accessed row, all cells of an accessed column) may be rewritten after the access operation.

In some examples, reading a memory cell 105 may be non-destructive. That is, the logic state of the memory cell 105 may not need to be rewritten after the memory cell 105 is read. For example, in non-volatile memory such as PCM, accessing the memory cell 105 may not destroy the logic state and, thus, the memory cell 105 may not require rewriting after accessing. However, in various examples, refreshing the logic state of the memory cell 105 may or may not be needed in the absence of access operations. For example, the logic state stored by a memory cell 105 may be refreshed at periodic intervals by applying an appropriate write or refresh pulse to maintain the stored logic state. Refreshing the memory cell 105 may reduce or eliminate read disturb errors or logic state corruption due to a charge leakage or a change in an atomic configuration of a memory element over time.

A memory cell 105 may also be set, or written, by activating the relevant first access line 110, second access line 115, and/or third access line 120—e.g., a logic state may be stored in the memory cell 105. Column decoder 135 or row decoder 125 may accept data, for example via input/output component 140, to be written to the memory cells 105. In various examples, a write operation may be performed at least in part by a sense component 130, or a write operation may be configured to bypass a sense component 130.

In the case of a capacitive memory element, a memory cell 105 may be written by applying a voltage to the capacitor, and then isolating the capacitor (e.g., isolating the capacitor from a voltage source used to write the memory cell 105) to store a charge in the capacitor associated with a desired logic state. In the case of ferroelectric memory, a ferroelectric memory element (e.g., a ferroelectric capacitor) of a memory cell 105 may written by applying a voltage with a magnitude high enough to polarize the ferroelectric memory element (e.g., applying a saturation voltage) with a polarization associated with a desired logic state, and the ferroelectric memory element may be isolated (e.g., floating), or a zero net voltage may be applied across the ferroelectric memory element (e.g., grounding, virtually grounding the ferroelectric memory element). In the case of PCM, a memory element may be written by applying a current with a profile that causes (e.g., by way of heating and cooling) the memory element to form an atomic configuration associated with a desired logic state.

In various examples in accordance with the present disclosure, an amplifier component (not shown) may be provided, such as an amplifier component in a signal development circuit between a memory cell 105 and a sense component 130, or a signal development portion of a sense component 130, to support the generation of sensing signals used to determine a logic state stored by a memory cell 105. An access line for a target memory cell 105 may be precharged using the amplifier component (e.g., at least in part by coupling the access line with the amplifier component), and the logic state stored by the target memory cell 105 may be determined using the amplifier component (e.g., based on amplifying a voltage of the access line using the amplifier component)—thus, precharging the access line and determining the logic state of the memory cell may both use the amplifier component, such that any inherent offset (e.g., offset voltage) of the amplifier component may be present in both operations and its impact nullified or mitigated and sensing a logic state stored by a memory cell 105 using the same device. The amplifier component may be referred to as a sense amplifier. In some cases, the amplifier component may include a differential amplifier having two input nodes (e.g., two input terminals) and an output node (e.g., an output terminal). In some cases, the amplifier component may include a folded cascode amplifier with one input node (e.g., one input terminal) and one output node (e.g., one output terminal).

Figure 2:
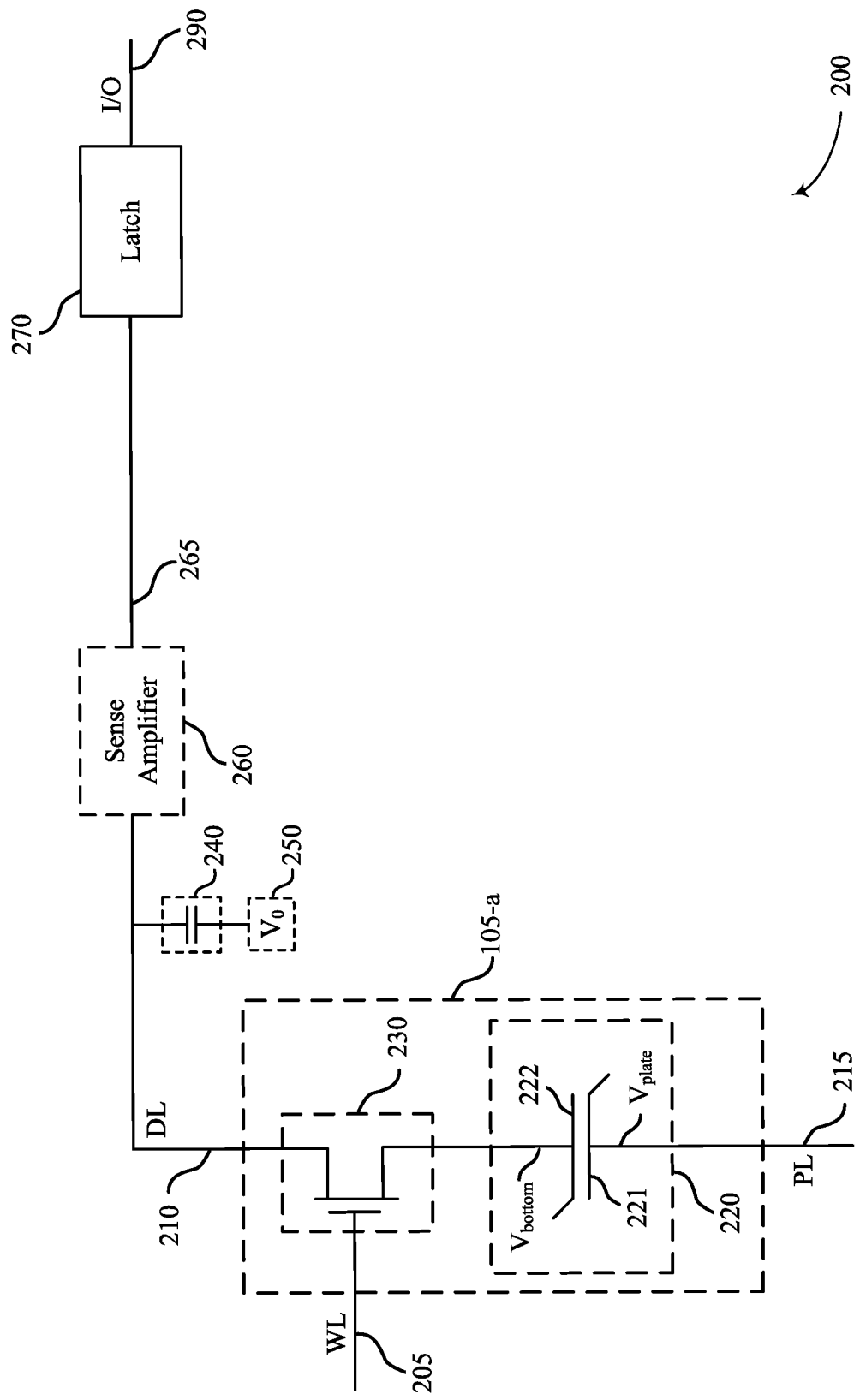
FIG. 2 illustrates an example of a memory die that supports write techniques of a memory device with a charge transfer device in accordance with aspects of the present disclosure.

FIG. 2 illustrates an example circuit 200 that supports amplifier component schemes for sensing memory cells in accordance with various embodiments of the present disclosure. Circuit 200 may include a memory cell 105-*a*, a sense amplifier 260, and a latch 270, which in some cases may be examples of a memory cell 105 and aspects of a sense component 130 described with reference to FIG. 1. Circuit 200 may also include a word line 205, a digit line 210, and a plate line 215, which, in some examples, may correspond to a first access line 110, a second access line 115, and a third access line 120, respectively, as described with reference to FIG. 1.

Memory cell 105-*a* may include a logic storage component (e.g., a memory element), such as capacitor 220 that has a first plate, cell plate 221, and a second plate, cell bottom 222. The cell plate 221 and the cell bottom 222 may be capacitively coupled through a dielectric material positioned between them (e.g., in a DRAM application), or capacitively coupled through a ferroelectric material positioned between them (e.g., in a FeRAM application). The cell plate 221 may be associated with a voltage $V_{plate}$, and cell bottom 222 may be associated with a voltage $V_{bottom}$, as illustrated in the circuit 200. The orientation of cell plate 221 and cell bottom 222 may be different (e.g., flipped) without changing the operation of the memory cell 105-*a*. The cell plate 221 may be accessed via the plate line 215 and cell bottom 222 may be accessed via the digit line 210. As described herein, various states may be stored by charging, discharging, and/or polarizing the capacitor 220.

Capacitor 220 may be in electronic communication with digit line 210, and the stored logic state of capacitor 220 may be read or sensed by operating various elements represented in circuit 200. For example, the memory cell 105-*a* may also include a selection component 230, and the capacitor 220 can be coupled with digit line 210 when selection component 230 is activated, and the capacitor 220 can be isolated from digit line 210 when selection component 230 is deactivated.

Activating the cell selection component 230 may be referred to as selecting the memory cell 105-*a* in some examples, and deactivating the cell selection component 230 may be referred to as deselecting the memory cell 105-*a* in some examples. In some examples, the cell selection component 230 is a transistor and its operation is controlled by applying an activation voltage to the transistor gate, where the voltage for activating the transistor (e.g., the voltage between the transistor gate terminal and the transistor source terminal) is greater than the threshold voltage magnitude of the transistor. The word line 205 may be used to activate the cell selection component 230. For example, a selection voltage applied to the word line 205 (e.g., a word line logical signal) may be applied to the gate of a transistor of cell selection component 230, which may connect the capacitor 220 with the digit line 210 (e.g., providing a conductive path between the capacitor 220 and the digit line 210).

In other examples, the positions of the cell selection component 230 and the capacitor 220 in the memory cell 105-*a* may be switched, such that cell selection component 230 is coupled with or between the plate line 215 and the cell plate 221, and the capacitor 220 is coupled with or between the digit line 210 and the other terminal of the cell selection component 230. In such an embodiment, the cell selection component 230 may remain in electronic communication with the digit line 210 through the capacitor 220. This configuration may be associated with alternative timing and biasing for access operations.

In examples that employ a ferroelectric capacitor 220, the capacitor 220 may not fully discharge upon connection to digit line 210. In various schemes, to sense the logic state stored by a ferroelectric capacitor 220, a voltage may be applied to plate line 215 and/or digit line 210, and the word line 205 may be biased to select memory cell 105-*a*. In some cases, the plate line 215 and/or digit line 210 may be virtually grounded and then isolated from the virtual ground, which may be referred to as a floating condition, prior activating the word line 205.

Operation of the memory cell 105-*a* by varying the voltage to cell plate 221 (e.g., via the plate line 215) may be referred to as "moving the cell plate." Biasing the plate line 215 and/or the digit line 210 may result in a voltage difference (e.g., the voltage of the digit line 210 minus the voltage of the plate line 215) across the capacitor 220. The voltage difference may accompany a change in the stored charge on capacitor 220, where the magnitude of the change in stored charge may depend on the initial state of the capacitor 220 (e.g., whether the initial logic state stored a logic 1 or a logic 0). In some schemes, the change in the stored charge of the capacitor 220 may cause a change in the voltage of the digit line 210, which may be amplified by the sense amplifier 260 and used by the latch 270 to determine the stored logic state of the memory cell 105-*aa*.

The digit line 210 may be coupled with many memory cells 105, and the digit line 210 may have properties that result in a non-negligible intrinsic capacitance 240 (e.g., on the order of picofarads (pF)), which may couple the digit line 210 with a voltage source 250. The voltage source 250 may represent a common ground or virtual ground voltage, or the voltage of an adjacent access line of the circuit 200 (not shown). Although illustrated as a separate component in FIG. 2, the intrinsic capacitance 240 may be associated with properties distributed throughout the digit line 210.

In various examples, the intrinsic capacitance 240 may depend on physical characteristics of the digit line 210, including conductor dimensions (e.g., length, width, thickness) of the digit line 210. The intrinsic capacitance 240 may also depend on characteristics of adjacent access lines or circuit components, proximity to such adjacent access lines or circuit components, or insulation characteristics between the digit line 210 and such access lines or circuit components. Thus, a change in voltage of digit line 210 after selecting the memory cell 105-a may depend on the net capacitance of (e.g., associated with) the digit line 210. In other words, as charge flows along the digit line 210, some finite charge may be stored in the digit line 210 (e.g., in the intrinsic capacitance 240, other capacitance coupled with the digit line 210), and the resulting voltage of the digit line 210 may depend on the net capacitance of the digit line 210.

In some cases, the resulting voltage of the digit line 210 at some time after selecting the memory cell 105-a may be compared to a reference (e.g., a voltage of the reference line 265) by the latch 270 to determine the logic state that was stored in the memory cell 105-a. Other operations may be used to support selecting and/or sensing the memory cell 105-a, including operations for supporting differential amplifier schemes for sensing memory cells as described herein.

In some examples, the sense amplifier 260 may be an example of a signal development circuit coupled with or between the memory cell 105-a and the latch 270. The sense amplifier 260 may amplify or otherwise convert signals of the digit line 210 prior to or as part of a sensing operation. The sense amplifier 260 may include, for example, a transistor, transistors in a cascode arrangement, a differential amplifier, or any other charge or voltage amplifier. In some examples, a line between the latch 270 and the sense amplifier 260 may be referred to as a signal line (e.g., signal line 265).

Although the digit line 210 and the signal line 265 are identified as separate lines, the digit line 210, the signal line 265, and any other lines connecting a memory cell 105 with a sense component 130 may be referred to as an access line in accordance with the present disclosure. Constituent portions of such an access line may be identified separately for the purposes of illustrating intervening components and intervening signals in various example configurations.

The latch 270 may include various transistors or amplifiers to detect and amplify a difference in signals, which may be referred to as latching. The output of the latch 270, corresponding to the detected logic state of memory cell 105-a, may then be output via one or more input/output (I/O) lines (e.g., I/O line 290), which may include an output through a column decoder 135 via input/output component 140 described with reference to FIG. 1.

To perform a write operation on the memory cell 105-a, a voltage may be applied across the capacitor 220. Various methods may be used. In one example, the selection component 230 may be activated through the word line 205 in order to electrically connect the capacitor 220 to the digit line 210. A voltage may be applied across capacitor 220 by controlling the voltage of cell plate 221 (e.g., through plate line 215) and cell bottom 222 (e.g., through digit line 210).

For example, to write a logic 0, cell plate 221 may be taken high (e.g., applying a positive voltage to plate line 215), and cell bottom 222 may be taken low (e.g., grounding digit line 210, virtually grounding digit line 210, applying a negative voltage to digit line 210). The opposite process may be performed to write a logic 1, where cell plate 221 is taken low and cell bottom 222 is taken high. In some cases, the voltage applied across the capacitor 220 during a write operation may have a magnitude equal to or greater than a saturation voltage of a ferroelectric material in the capacitor 220, such that the capacitor 220 is polarized, and thus maintains a charge even when the magnitude of applied voltage is reduced, or if a zero net voltage is applied across the capacitor 220. In some examples, the latch 270 may be used to perform the write operations, which may include coupling the first sense component voltage source 250-b or the second sense component voltage source 250-c with the digit line. When the latch 270 is used to perform the write operations, the sense amplifier 260 may or may not be bypassed.

The circuit 200, including the latch 270, the cell selection component 230, or the sense amplifier 260, may include various types of transistors. For example, the circuit 200 may include n-type transistors, where applying a relative positive voltage to the gate of the n-type transistor that is above a threshold voltage for the n-type transistor (e.g., an applied voltage having a positive magnitude, relative to a source terminal, that is greater than a threshold voltage) enables a conductive path between the other terminals of the n-type transistor (e.g., the source terminal and a drain terminal).

In some examples, the n-type transistor may act as a switching component, where the applied voltage is a logical signal that is used to enable conductivity through the transistor by applying a relatively high logical signal voltage (e.g., a voltage corresponding to a logic 1 state, which may be associated with a positive logical signal voltage supply), or to disable conductivity through the transistor by applying a relatively low logical signal voltage (e.g., a voltage corresponding to a logic 0 state, which may be associated with a ground or virtual ground voltage). In various examples where a n-type transistor is employed as a switching component, the voltage of a logical signal applied to the gate terminal may be selected to operate the transistor at a particular working point (e.g., in a saturation region or in an active region).

In some examples, the behavior of a n-type transistor may be more complex than a logical switching, and selective conductivity across the transistor may also be a function of varying source and drain voltages. For example, the applied voltage at the gate terminal may have a particular voltage level (e.g., a clamping voltage) that is used to enable conductivity between the source terminal and the drain terminal when the source terminal voltage is below a certain level (e.g., below the gate terminal voltage minus the threshold voltage). When the voltage of the source terminal voltage or drain terminal voltage rises above the certain level, the n-type transistor may be deactivated such that the conductive path between the source terminal and drain terminal is opened.

Additionally or alternatively, the circuit 200 may include p-type transistors, where applying a relative negative voltage to the gate of the p-type transistor that is above a threshold voltage for the p-type transistor (e.g., an applied voltage having a negative magnitude, relative to a source terminal, that is greater than a threshold voltage) enables a conductive path between the other terminals of the p-type transistor (e.g., the source terminal and a drain terminal).

In some examples, the p-type transistor may act as a switching component, where the applied voltage is a logical signal that is used to enable conductivity by applying a relatively low logical signal voltage (e.g., a voltage corresponding to a logical "1" state, which may be associated with a negative logical signal voltage supply), or to disable conductivity by applying a relatively high logical signal voltage (e.g., a voltage corresponding to a logical "0" state, which may be associated with a ground or virtual ground voltage). In various examples where an p-type transistor is employed as a switching component, the voltage of a logical signal applied to the gate terminal may be selected to operate the transistor at a particular working point (e.g., in a saturation region or in an active region).

In some examples, the behavior of a p-type transistor may be more complex than a logical switching by the gate voltage, and selective conductivity across the transistor may also be a function of varying source and drain voltages. For example, the applied voltage at the gate terminal may have a particular voltage level that is used to enable conductivity between the source terminal and the drain terminal so long as the source terminal voltage is above a certain level (e.g., above the gate terminal voltage plus the threshold voltage). When the voltage of the source terminal voltage falls below the certain level, the p-type transistor may be deactivated such that the conductive path between the source terminal and drain terminal is opened.

A transistor of the circuit 200 may be a field-effect transistor (FET), including a metal oxide semiconductor FET, which may be referred to as a MOSFET. These, and other types of transistors may be formed by doped regions of material on a substrate. In various examples the transistor(s) may be formed on a substrate that is dedicated to a particular component of the circuit 200 (e.g., a substrate for the latch 270, a substrate for the sense amplifier 260, a substrate for the memory cell 105-a), or the transistor(s) may be formed on a substrate that is common for particular components of the circuit 200 (e.g., a substrate that is common for the latch 270, the sense amplifier 260, and the memory cell 105-a). Some FETs may have a metal portion including aluminum or other metal, but some FETs may implement other non-metal materials such as polycrystalline silicon, including those FETs that may be referred to as a MOSFET. Further, although an oxide portion may be used as a dielectric portion of a FET, other non-oxide materials may be used in a dielectric material in a FET, including those FETs that may be referred to as a MOSFET.

In various examples in accordance with the present disclosure, sensing a logical state stored by the memory cell 105-a may include precharging the digit line 210, or another access line for the memory cell 105-a (e.g., an electrode that may be selectively coupled with the digit line 210), using the sense amplifier 260. The sense amplifier 260 may have an offset voltage (e.g., an unpredictable and/or undesirable voltage parameter, such a threshold voltage), and precharging the digit line 210 using the sense amplifier 260 may account for the offset voltage when later amplifying the digit line voltage using the sense amplifier. In some cases, though illustrated in FIG. 2 as having a single input, the sense amplifier 260 may comprise a differential amplifier with two inputs. In some cases, the sense amplifier 260 may comprise a single-ended amplifier, such as a folded cascode amplifier.

Figure 3:
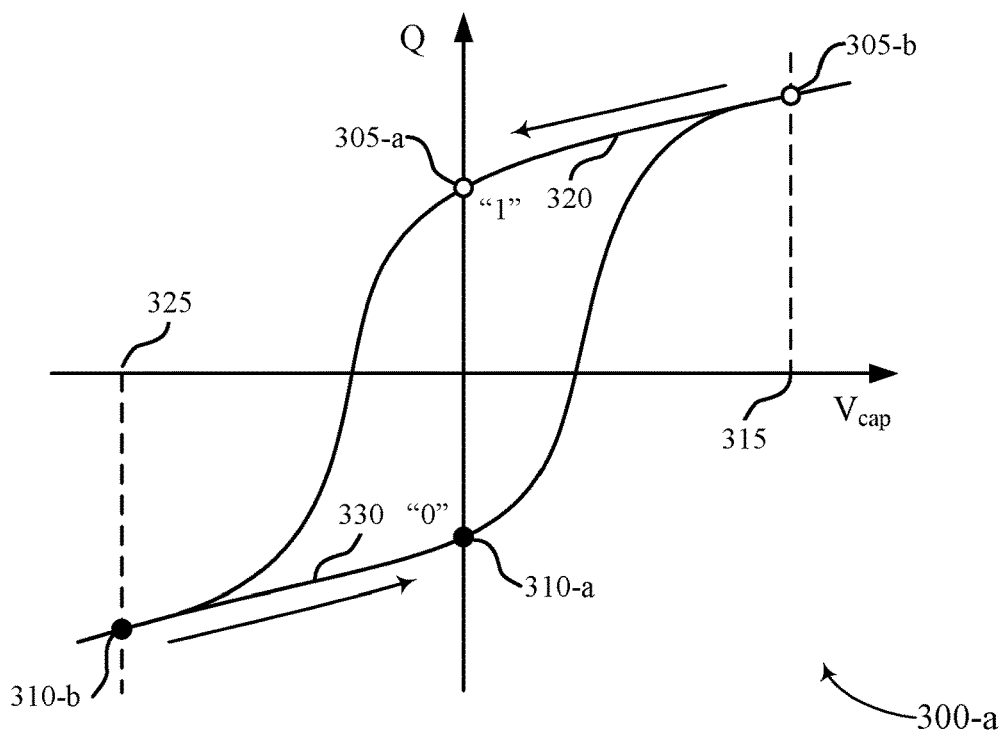
FIG. 3 illustrates examples of non-linear electrical properties with hysteresis plots for memory cell sensing based on precharging an access line using a sense amplifier in accordance with examples of the present disclosure
Figure 3:
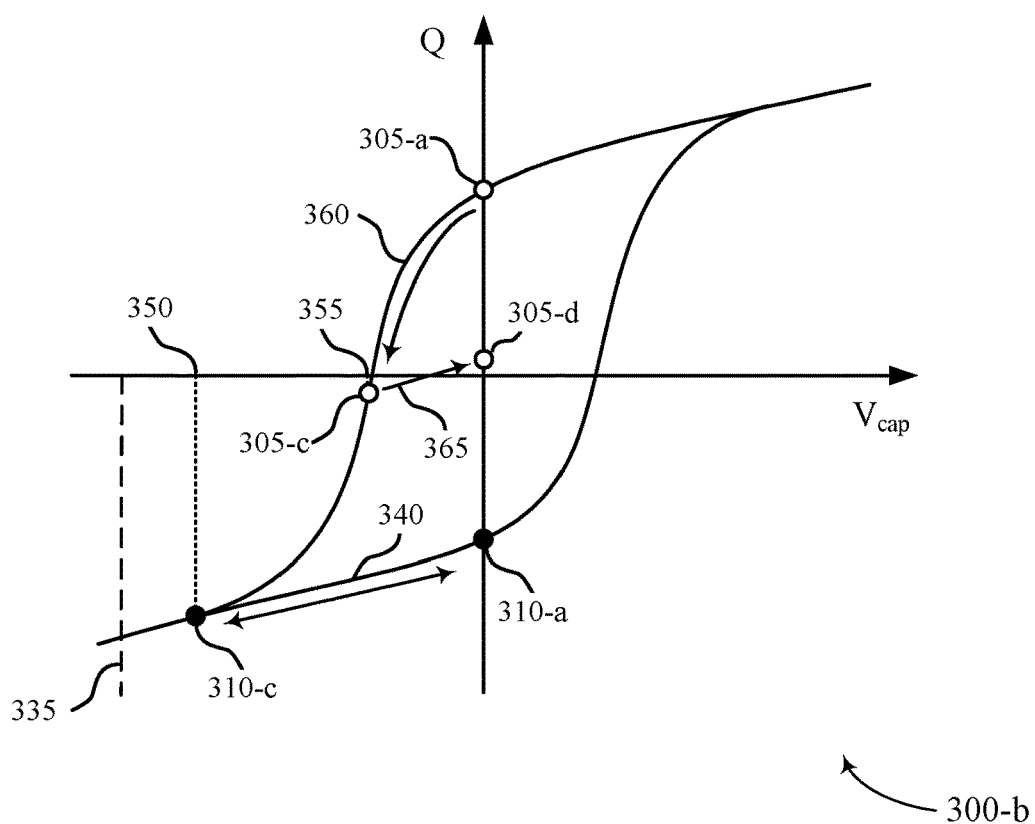

FIG. 3 illustrates an example of non-linear electrical properties with hysteresis plots 300-a and 300-b for a memory cell 105 that supports memory cell sensing based on precharging an access line using a sense amplifier in accordance with various embodiments of the present disclosure. A ferroelectric material is characterized by a spontaneous electric polarization, where the material may maintain a non-zero electric charge in the absence of an electric field. Examples of ferroelectric materials include barium titanate (BaTiO3), lead titanate (PbTiO3), lead zirconium titanate (PZT), and strontium bismuth tantalate (SBT). Ferroelectric capacitors 220 described herein may include these or other ferroelectric materials. Electric polarization within a ferroelectric capacitor 220 results in a net charge at the surface of the ferroelectric material, and attracts opposite charge through the terminals of the ferroelectric capacitor 220. Thus, charge is stored at the interface of the ferroelectric material and the capacitor terminals. Because the electric polarization may be maintained in the absence of an externally applied electric field for relatively long times, even indefinitely, charge leakage may be significantly decreased as compared with, for example, capacitors without ferroelectric properties such as those used in DRAM arrays. Employing ferroelectric materials may reduce the need to perform refresh operations as described above for some DRAM architectures, such that maintaining logic states of an FeRAM architecture may be associated with substantially lower power consumption than maintaining logic states of a DRAM architecture.

The hysteresis plots 300-a and 300-b may be understood from the perspective of a single terminal of a ferroelectric capacitor 220. By way of example, if the ferroelectric material has a negative polarization, positive charge accumulates at the associated terminal of the ferroelectric capacitor 220. Likewise, if the ferroelectric material has a positive polarization, a negative charge accumulates at the associated terminal of the ferroelectric capacitor 220.

Additionally, it should be understood that the voltages in the hysteresis plots 300-a and 300-b represent a voltage difference across the capacitor (e.g., between the terminals of the ferroelectric capacitor 220) and are directional. For example, a positive voltage may be realized by applying a positive voltage to the perspective terminal (e.g., a cell bottom 222) and maintaining the reference terminal (e.g., a cell plate 221) at ground or virtual ground (or approximately zero volts (0V)). In some examples, a negative voltage may be applied by maintaining the perspective terminal at ground and applying a positive voltage to the reference terminal (e.g., cell plate 221). In other words, positive voltages may be applied to arrive at a negative voltage difference $V_{cap}$ across the ferroelectric capacitor 220 and thereby negatively polarize the terminal in question. Similarly, two positive voltages, two negative voltages, or any combination of positive and negative voltages may be applied to the appropriate capacitor terminals to generate the voltage difference $V_{cap}$ shown in the hysteresis plots 300-a and 300-b.

As depicted in the hysteresis plot 300-a, a ferroelectric material used in a ferroelectric capacitor 220 may maintain a positive or negative polarization when there is no net voltage difference between the terminals of the ferroelectric capacitor 220. For example, the hysteresis plot 300-a illustrates two possible polarization states, a charge state 305-a and a charge state 310-b, which may represent a positively saturated polarization state and a negatively saturated polarization state, respectively. The charge states 305-a and 310-a may be at a physical condition illustrating remnant polarization (Pr) values, which may refer to the polarization (or charge) that remains upon removing the external bias (e.g., voltage). The coercive voltage is the voltage at which the charge (or polarization) is zero. According to the example of the hysteresis plot 300-a, the charge state 305-a may represent a logic 0 when no voltage difference is applied across the ferroelectric capacitor 220, and the charge state 310-a may represent a logic 1 when no voltage difference is applied across the ferroelectric capacitor 220. In some examples, the logic values of the respective charge states may be reversed to accommodate other schemes for operating a memory cell 105.

A logic 0 or 1 may be written to the memory cell by controlling the electric polarization of the ferroelectric material, and thus the charge on the capacitor terminals, by applying a net voltage difference across the ferroelectric capacitor 220. For example, the voltage 315 may be a voltage equal to or greater than a positive saturation voltage, and applying the voltage 315 across the ferroelectric capacitor 220 may result in charge accumulation until the charge state 305-b is reached (e.g., writing a logic 0).

Upon removing the voltage 315 from the ferroelectric capacitor 220 (e.g., applying a zero net voltage across the terminals of the ferroelectric capacitor 220), the charge state of the ferroelectric capacitor 220 may follow the path 320 shown between the charge state 305-b and the charge state 305-a at zero voltage across the capacitor. Similarly, voltage 325 may be a voltage equal to or lesser than a negative saturation voltage, and applying the voltage 325 across the ferroelectric capacitor 220 results in charge accumulation until the charge state 310-b is reached (e.g., writing a logic 1). Upon removing the voltage 325 from the ferroelectric capacitor 220 (e.g., applying a zero net voltage across the terminals of the ferroelectric capacitor 220), the charge state of the ferroelectric capacitor 220 may follow the path 330 shown between the charge state 310-b and the charge state 310-a at zero voltage across the capacitor. In some examples, the voltage 315 and the voltage 325, representing saturation voltages, may have the same magnitude, but opposite polarity.

To read, or sense, the stored state of a ferroelectric capacitor 220, a voltage may also be applied across the ferroelectric capacitor 220. In response to the applied voltage, the subsequent charge Q stored by the ferroelectric capacitor changes, and the degree of the change may depend on the initial polarization state, the applied voltages, intrinsic capacitance on access lines, and other factors. In other words, the charge state resulting from a read operation may depend on whether the charge state 305-a or the charge state 310-a was initially stored, among other factors.

The hysteresis plot 300-b illustrates an example of reading of stored charge states 305-a and 310-a. A read voltage 335 may be applied, for example, as a voltage difference via a digit line 210 and a plate line 215 as described with reference to FIG. 2. The hysteresis plot 300-b may illustrate read operations where the read voltage 335 is negative voltage difference $V_{cap}$ (e.g., where $V_{bottom}-V_{plate}$ is negative). A negative read voltage across the capacitor may be referred to as a "plate high" read operation, where a plate line 215 is taken initially to a high voltage, and a digit line 210 is initially at a low voltage (e.g., a ground voltage). Although the read voltage 335 is shown as a negative voltage across the ferroelectric capacitor 220, in alternative operations a read voltage may be a positive voltage across the ferroelectric capacitor 220, which may be referred to as a "plate low" read operation.

The read voltage 335 may be applied across the ferroelectric capacitor 220 when a memory cell 105 is selected (e.g., by activating a cell selection component 230 as described with reference to FIG. 2). Upon applying the read voltage 335 to the ferroelectric capacitor 220, charge may flow into or out of the ferroelectric capacitor 220 via the digit line 210 and plate line 215, and different charge states may result depending on whether the ferroelectric capacitor 220 was at the charge state 305-a (e.g., a logic 1) or at the charge state 310-a (e.g., a logic 0).

When performing a read operation on a ferroelectric capacitor 220 at the charge state 310-a (e.g., a logic 0), additional negative charge may accumulate across the ferroelectric capacitor 220, and the charge state may follow path 340 until reaching the charge and voltage of the charge state 310-c. The amount of charge flowing through the capacitor 220 may be related to the intrinsic capacitance of the digit line 210 (e.g., intrinsic capacitance 240 described with reference to FIG. 2).

Accordingly, as shown by the transition between the charge state 310-a and the charge state 310-c, the resulting voltage 350 may be a relatively large negative value due to the relatively large change in voltage for the given change in charge. Thus, upon reading a logic 0 in a "plate high" read operation, the digit line voltage, equal to the sum of $V_{PL}$ and the value of ($V_{bottom}-V_{plate}$) at the charge state 310-c, may be a relatively low voltage. Such a read operation may not change the remnant polarization of the ferroelectric capacitor 220 that stored the charge state 310-a, and thus after performing the read operation the ferroelectric capacitor 220 may return to the charge state 310-a via path 340 when the read voltage 335 is removed (e.g., by applying a zero net voltage across the ferroelectric capacitor 220). Thus, performing a read operation with a negative read voltage on a ferroelectric capacitor 220 with a charge state 305-a may be considered a non-destructive read process.

When performing the read operation on the ferroelectric capacitor 220 at the charge state 305-a (e.g., a logic 1), the stored charge may reverse polarity as a net negative charge accumulates across the ferroelectric capacitor 220, and the charge state may follow the path 360 until reaching the charge and voltage of the charge state 305-c. The amount of charge flowing through the capacitor 220 may again be related to the intrinsic capacitance of the digit line 210 (e.g., intrinsic capacitance 240 described with reference to FIG. 2). Accordingly, as shown by the transition between the charge state 305-a and the charge state 305-c, the resulting voltage 355 may be a relatively small negative value due to the relatively small change in voltage for the given change in charge. Thus, upon reading a logic 1 in a "plate high" read operation, the digit line voltage, equal to the sum of $V_{PL}$ and the value of ($V_{bottom}-V_{plate}$) at the charge state 310-c, may be a relatively high voltage.

In various examples, a read operation with a negative read voltage (e.g., read voltage 335) may result in a reduction or a reversal of remnant polarization of the capacitor 220 that stored the charge state 305-a. In other words, according to the properties of the ferroelectric material, after performing the read operation the ferroelectric capacitor 220 may not return to the charge state 305-a when the read voltage 335 is removed (e.g., by applying a zero net voltage across the capacitor 220). Rather, when applying a zero net voltage across the ferroelectric capacitor 220 after a read operation with read voltage 335, the charge state may follow path 365 from the charge state 305-c to the charge state 305-d, illustrating a net reduction in polarization magnitude (e.g., a less positively polarized charge state than initial charge state 305-a). Thus, performing a read operation with a negative read voltage on a ferroelectric capacitor 220 with a charge state 305-a may be a destructive read process. However, in some sensing schemes, a reduced remnant polarization may still be read as the same stored logic state as a saturated remnant polarization state (e.g., supporting detection of a logic 1 from both the charge state 305-a and the charge state 305-d), thereby providing a degree of non-volatility for a memory cell 105 with respect to read operations.

The transition from the charge state 305-*a* to the charge state 305-*d* may be illustrative of a sensing operation that is associated with a partial reduction and/or partial reversal in polarization of a ferroelectric capacitor 220 of a memory cell 105 (e.g., a reduction in the magnitude of charge Q from the charge state 305-*a* to the charge state 305-*d*). In various examples, the amount of change in polarization of a ferroelectric capacitor 220 of a memory cell 105 as a result of a sensing operation may be selected according to a particular sensing scheme. In some examples, sensing operations having a greater change in polarization of a ferroelectric capacitor 220 of a memory cell 105 may be associated with relatively greater robustness in detecting a logic state of a memory cell 105. In some sensing schemes, sensing a logic 0 of a ferroelectric capacitor 220 at the charge state 305-*a* may result in a full reversal of polarization, with the ferroelectric capacitor 220 transitioning from the charge state 305-*a* to the charge state 310-*a* after the sensing operation.

The position of the charge state 305-*c* and the charge state 310-*c* after initiating a read operation may depend on a number of factors, including the specific sensing scheme and circuitry. In some cases, the final charge may depend on the net capacitance of the digit line 210 coupled with the memory cell 105, which may include an intrinsic capacitance 240, integrator capacitors, and others. For example, if a ferroelectric capacitor 220 is electrically coupled with digit line 210 at 0V and the read voltage 335 is applied to the plate line, the voltage of the digit line 210 may rise when the memory cell 105 is selected due to charge flowing from the ferroelectric capacitor 220 to the net capacitance of the digit line 210. Thus, a voltage measured at a sense component 130 may not be equal to the read voltage 335, or the resulting voltages 350 or 355, and instead may depend on the voltage of the digit line 210 following a period of charge sharing.

The position of the charge state 305-*c* and the charge state 310-*c* on hysteresis plot 300-*b* upon initiating a read operation may depend on the net capacitance of the digit line 210 and may be determined through a load-line analysis. In other words, the charge states 305-*c* and 310-*c* may be defined with respect to the net capacitance of the digit line 210. As a result, the voltage of the ferroelectric capacitor 220 after initiating a read operation (e.g., voltage 350 when reading the ferroelectric capacitor 220 that stored the charge state 310-*a*, voltage 355 when reading the ferroelectric capacitor 220 that stored the charge state 305-*a*), may be different and may depend on the initial state of the ferroelectric capacitor 220.

The initial state of the ferroelectric capacitor 220 may be determined by comparing the voltage of a digit line 210 (or signal line 265, where applicable) resulting from the read operation with a reference voltage (e.g., via a reference line 265 as described with reference to FIG. 2, or via a common access line). In some examples, the digit line voltage may be the sum of the plate line voltage and the final voltage across the ferroelectric capacitor 220 (e.g., voltage 350 when reading the ferroelectric capacitor 220 having a stored the charge state 310-*a*, or voltage 355 when reading the ferroelectric capacitor 220 having a stored the charge state 305-*a*). In some examples, the digit line voltage may be the difference between the read voltage 335 and the final voltage across the capacitor 220 (e.g., (read voltage 335-voltage 350) when reading the ferroelectric capacitor 220 having a stored the charge state 310-*a*, (read voltage 335-voltage 355) when reading the ferroelectric capacitor 220 having a stored the charge state 305-*a*).

In some sensing schemes, a reference voltage may be generated such that the reference voltage is between the possible voltages that may result from reading different logic states. For example, a reference voltage may be selected to be lower than the resulting digit line voltage when reading a logic 1, and higher than the resulting digit line voltage when reading a logic 0. In other examples a comparison may be made at a portion of a sense component 130 that is different from a portion where a digit line is coupled, and therefore a reference voltage may be selected to be lower than the resulting voltage at the comparison portion of the sense component 130 when reading a logic 1, and higher than the resulting voltage at the comparison portion of the sense component 130 when reading a logic 0. During comparison by the sense component 130, the voltage based on the sensing may be determined to be higher or lower than the reference voltage, and the stored logic state of the memory cell 105 (e.g., a logic 0, a logic 1) may thus be determined.

During a sensing operation, the resulting signals from reading various memory cells 105 may be a function of manufacturing or operational variations between the various memory cells 105. For example, capacitors of various memory cells 105 may have different levels of capacitance or saturation polarization, so that a logic 1 may be associated with different levels of charge from one memory cell to the next, and a logic 0 may be associated with different levels of charge from one memory cell to the next. Further, intrinsic capacitance (e.g., intrinsic capacitance 240 described with reference to FIG. 2) may vary from one digit line 210 to the next digit line 210 in a memory device, and may also vary within a digit line 210 from the perspective of one memory cell 105 to the next memory cell 105 on the same digit line. Thus, for these and other reasons, reading a logic 1 may be associated with different levels of digit line voltage from one memory cell to the next (e.g., resulting voltage 350 may vary from reading one memory cell 105 to the next), and reading a logic 0 may be associated with different levels of digit line voltage from one memory cell to the next (e.g., resulting voltage 355 may vary from reading one memory cell 105 to the next).

In some examples, a reference voltage may be provided between a statistical average of voltages associated with reading a logic 1 and a statistical average of voltages associated with reading a logic 0, but the reference voltage may be relatively closer to the resulting voltage of reading one of the logic states for any given memory cell 105. The minimum difference between a resulting voltage of reading a particular logic state (e.g., as a statistical value for reading a plurality of memory cells 105 of a memory device) and an associated level of a reference voltage may be referred to as a "minimum read voltage difference," and having a low minimum read voltage difference may be associated with difficulties in reliably sensing the logic states of memory cells in a given memory device.

In some examples, the logic state of a memory cell may be detected using a read operation that employs memory cell sensing based on precharging an access line using a sense amplifier in accordance with aspects of the present disclosure. In some examples, a first component such as a charge transfer device or the like may be used to precharge an access line while a second component may be used for the sensing operation. One or both of the first component used for precharging and the second sensing component may have offset voltages. In the example that the sensing component has an offset voltage, this offset voltage may natively reside on the component. The offset voltage of the component may introduce inaccuracies into the sensing operation, by unintentionally shifting the sensed state in an unaccounted for direction. The offset voltage may be ambiguous and may vary from component to component, thus it may be difficult to mitigate the effects of the offset voltage. As discussed herein, the accuracy of the sensing operation may be improved by using a single device to precharge the access line and also sense the state of the memory cell. By using the same device to precharge the access line and sense the memory cell state, any offset of the precharging/sensing device may be inherently present in both precharging and sensing. This may effectively nullify or cancel out the offset voltage when the device senses the memory cell state, thus increasing the accuracy of the sensing operation.

Techniques are provided for memory cell sensing based on precharging an access line using a sense amplifier. Sensing a memory cell capable of storing one or more states may be improved by implementing a sense amplifier. The sense amplifier may precharge an access line to increase the reliability of the sensing operation. The access line may then charge share with the memory cell, which may result in high-level states and low-level states on the access line. Next, by precharging the access line with the sense amplifier and implementing charge sharing between the access line and a capacitor, which may be a reference capacitor, the high-level state and the low-level state on the access line may shift so that the two levels may be approximately centered around the precharge value on the access line.

Figure 4:
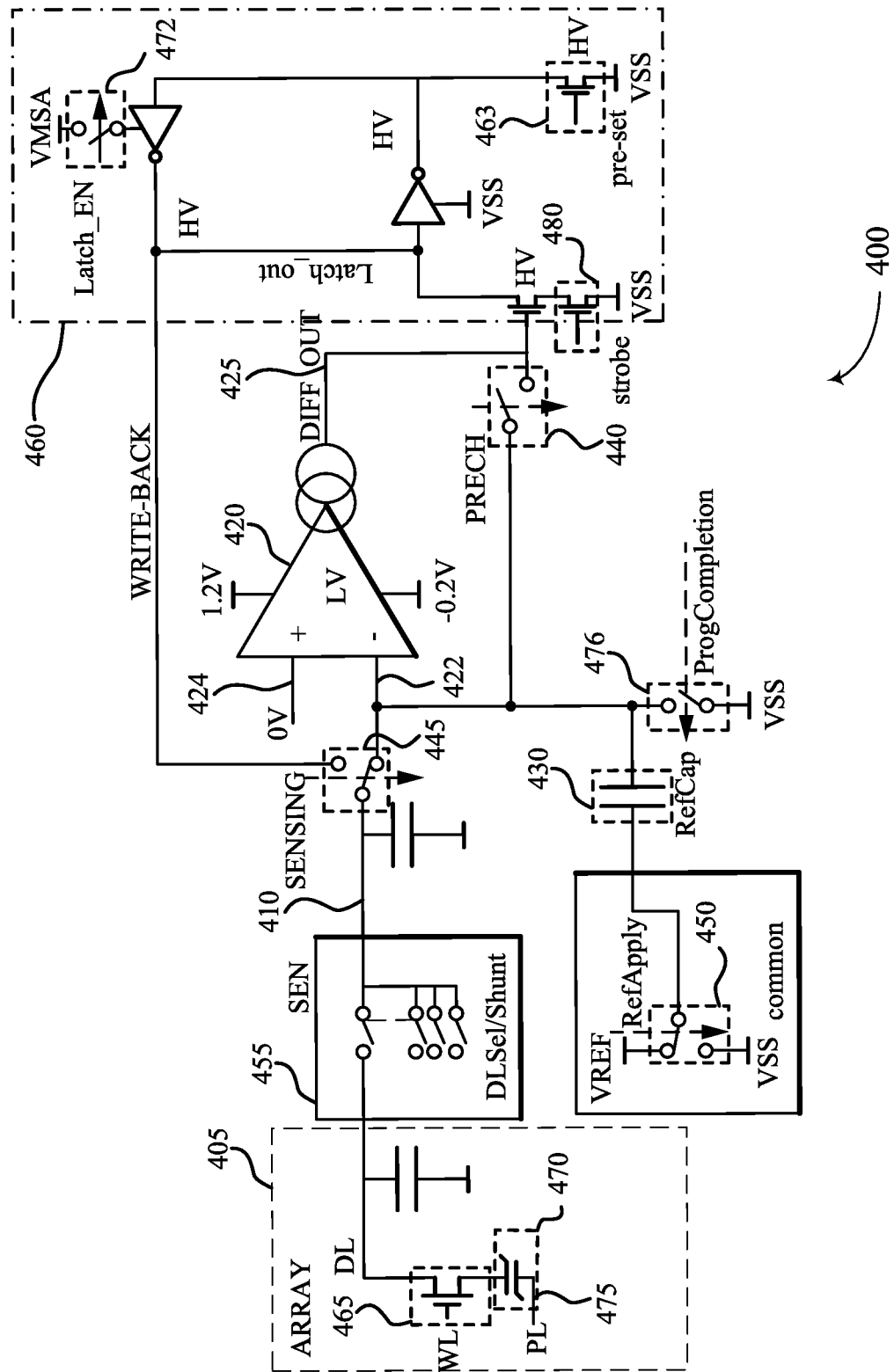
FIG. 4 illustrates an example of a circuit that supports memory cell sensing based on precharging an access line using a sense amplifier in accordance with aspects of the present disclosure.

FIG. 4 illustrates an example of a circuit 400 for memory cell sensing based on precharging an access line using a sense amplifier. In some examples, circuit 400 may include one or more components described above with reference to FIGS. 1, 2, and 3. For example, circuit 400 may include a memory cell 405, which may be an example of memory cell 105 as described with reference to FIG. 3; an access line 410, which may be an example of or selectively coupled with a digit line 210 as described with reference to FIG. 2; and a sense amplifier 420. The sense amplifier 420 may include an output 425, a first input 422, and a second input 424. The first input 422 may be coupled to the switch 445 and the second input 424 may be coupled to a voltage source. Circuit 400 may include a capacitor 430, a switch 440, a switch 445, a switch 450, a switch 455, and a latch 460. In some examples, the memory cell 405 may include a transistor (e.g., a switching component) 465, a capacitor 470, and a voltage source 475. Each of the switch 440, the switch 445, the switch 450, and the switch 455 may comprise, for example, one or more transistors.

In some examples, memory cell 405 may be indirectly coupled with the sense amplifier 420. For example, memory cell 405 may be coupled (e.g., selectively) with access line 410, which in turn, may be coupled with the sense amplifier 420 via the switch 445. The switch 445 may be in a first position or a second position. The first position of switch 445 may place the circuit 400 in a sensing mode and the second position of switch 445 may place the circuit 400 in a write-back mode. In write-back mode, the switch 445 may couple the memory cell 405 with latch 460. In one example, the switch 445 may be in the first position or sensing mode and switch 445 may couple the first input 422 of the sense amplifier with the access line 410.

Additionally, memory cell 405 may be coupled with switch 455 which may select a digit line (e.g., a digit line 210) and couple the selected digit line with the access line 410. In one example, the switch 455 may be one of multiple switches in which switch 455 is configured to select memory cell 405. Switch 455 may be in a first position or a second position. The first position of switch 455 may decouple the memory cell 405 from the sense amplifier 420 and the second position may couple the memory cell 405 with the sense amplifier 420, assuming that switch 445 is also in the first position.

In some examples, switch 440 may be in a first position or a second position. In the case switch 440 is in the first position, switch 440 may decouple the sense amplifier output 425 from the first input 422. In the case switch 440 is in the second position, switch 440 may couple the sense amplifier output 425 with the sense amplifier first input 422 to create a feedback loop.

In some examples, the sense amplifier first input 422 may be coupled with capacitor 430. Capacitor 430 may be also coupled with switch 450. Switch 450 may switch between a first position which may be ground or negative supply voltage VSS and a second position which may be a reference voltage (e.g., a positive voltage). In this example, switch 450 is in the second position. Either the first or the second position of the switch 450 may allow a charge to be placed on capacitor 430 when the other terminal of capacitor 430 is biased at (e.g., coupled with) a voltage such that a non-zero voltage differential exists across capacitor 430.

In some examples, latch 460 may vary depending on the desired characteristics of circuit 400. For example, various implementations of latch 460 may be configured to operate at different voltage levels or in view of various performance tradeoffs such as component count or complexity, footprint, operating speed, etc. Latch 460 may thus be configured to accommodate but may not significantly affect some of the functions as discussed with respect to other aspect of circuit 400. For example, latch 460 may not affect the functionality of the access line 410 being precharged by the sense amplifier 420, and also may not affect the charge sharing functions between the access line 410 and the memory cell 405, or the charge sharing between the capacitor 430 and the access line 410.

In FIG. 4, the access line 410 may be precharged to a first voltage. In precharging the access line, switch 440 may be in the second position to couple the sense amplifier output 425 with the sense amplifier first input 422. Additionally, switch 445 may be in the first position to couple the access line 410 with the sense amplifier 420. Generally, precharging may be based at least on coupling the access line 410 with the sense amplifier 420.

In the example of FIG. 4, the sense amplifier 420 may be a differential amplifier. In one example, the sense amplifier of FIGS. 4-9 may be a differential amplifier. In some examples, the access line 410 may be precharged to the first voltage which may be or otherwise reflect an offset voltage (e.g., an inherent or native voltage that is associated with the sense amplifier 420, and which may be an undesired or unpredictable voltage). For example, the first voltage may correspond to a target or desired precharge voltage, but the sense amplifier 420 may have an inherent offset of some voltage, and thus the first voltage to which the access line 410 is precharged may be the target precharge voltage plus/minus the offset voltage. In the example of FIG. 4, the target precharge voltage may be zero V, and thus the first voltage may equal the offset voltage of the sense amplifier 420 (e.g., 0.05V). In other examples, however, the target precharge voltage may be some other voltage (e.g., 1.5V, as in the example of FIG. 8), and thus first voltage may equal the target precharge voltage plus/minus the offset voltage (e.g., 1.55V), which may not equal the offset voltage of the sense amplifier 420.

The offset voltage associated with the sense amplifier 420 may vary from sense amplifier to sense amplifier and may be an inherent result of fabrication processes of the sense amplifier, properties of the Silicon crystal, impurities introduced in the growth processes of the Silicon crystal, the Silicon ingot itself, or any combination thereof, and so forth. The first voltage on the access line 410 may be based on the offset voltage and the voltage on the second input 424. The voltage on the second input 424 may be a target voltage, which in some cases may be approximately zero. Even though, the target voltage on the second input 424 may be set to zero, the sense amplifier 420 may still have an offset voltage associated with it and the offset voltage may precharge the access line 410. In some examples, the first voltage may be based on a gain of the sense amplifier 420. Additionally, the sense amplifier that contributes to the precharging of the access line 410 may also be the sense amplifier that senses the states of the memory cell.

Further in FIG. 4, after the first input 422 of the sense amplifier is decoupled from the output 425 of the sense amplifier, the access line 410 and the memory cell 405 may charge share. The access line 410 may transition from the first voltage to a second voltage at least partially due to the charge sharing between the access line 410 and the memory cell 405. When charge sharing occurs, switch 455 may be in the second position so that the memory cell 405 may be coupled with the access line 410.

Another charge sharing may occur between the access line 410 and the capacitor 430. The access line 410 may transition from the second voltage to a third voltage in this charge sharing operation. In one example, the capacitor 430 may be referred to as a reference capacitor. The capacitor 430 may be coupled with a reference voltage depending on the position of the switch 450. The switch 450 may be in a first position which may couple a reference voltage with the capacitor 430 or a second position which may couple the capacitor 430 with ground. In the example the switch 450 is in the first position and the capacitor 430 is coupled with the reference voltage, the amount of charge stored on capacitor 430 may be based at least on this reference voltage.

In one example, the charge sharing between the memory cell 405 and the access line 410 and the charge sharing between the access line 410 and the capacitor 430 may occur during at least partially overlapping time periods. In another example, the charge sharing between the memory cell 405 and the access line 410 may take place prior to the charge sharing between the access line 410 and the capacitor 430. Additionally, during any of the charge sharing operations the output 425 of the sense amplifier 420 may be coupled with a voltage source, for example, ground. In one example, by coupling the output 425 with ground, the duration of the sense operation may be improved by decreasing the time of the operation. Subsequent to the charge sharing between the memory cell 405 and the capacitor 430, the state of the memory cell may be determined based at least in part on amplifying the third voltage by employing the sense amplifier 420. The sense amplifier 420 may be the component that both precharges the access line 410 and also amplifies and senses the state of the memory cell 405. During one or both of the charge sharing operations, the output 425 may be coupled with ground to improve efficiency by reducing the total time of the sensing operation.

As previously discussed, in one example, the sense amplifier 420 may be a differential amplifier. When configured in an open loop, the sense amplifier 420 may behave similarly to a comparator. The trigger voltage or the voltage to activate the comparator may be the precharge value on the access line 410 less the voltage of the access line, which may include the offset voltage of the sense amplifier 420. For either the high or low case of the memory cell, the input different between the access line and the trigger voltage may depend on the selected memory cell state and the corresponding sign, such as positive for a high-level and negative for a low-level. In this way, the differential amplifier offset component self-compensates. The input difference may result in a relatively large differential output swing, so that the differential amplifier may be used as a comparator. Additionally, the differential output voltage may have a "digital" characteristic, such that the voltage may be a high-level or a low-level and may be used to directly interface logic gates of devices.

In the circuit diagrams discussed herein, a possible logic latch and write back implementation as illustrated in the example of the latch 460 may be employed. Further, any appropriate logic combination which implements similar functionality may be used, such as but not limited to flip-flop components or set reset latches.

Figure 5:
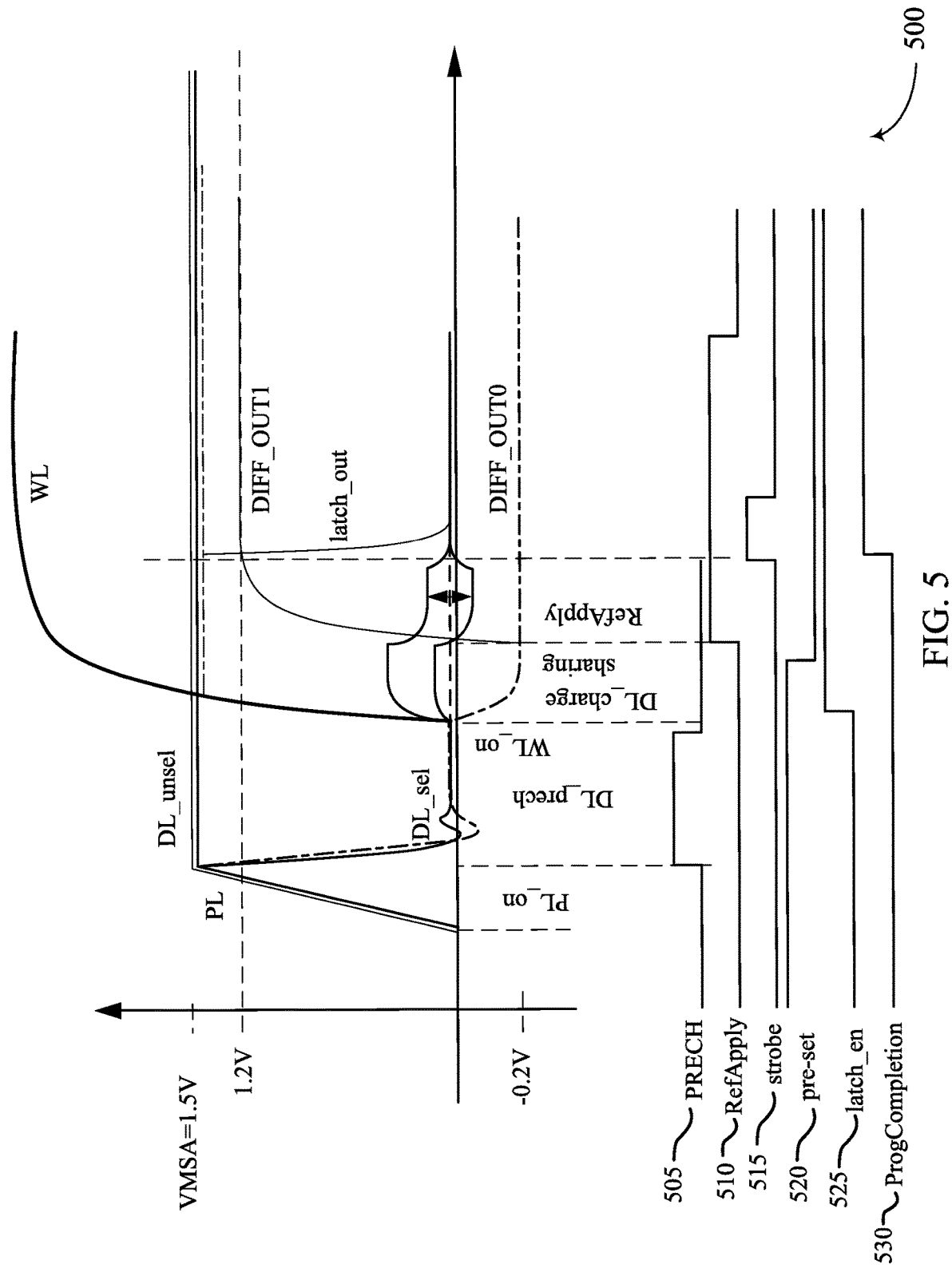
FIG. 5 illustrates an example of a timing diagram that supports memory cell sensing based on precharging an access line using a sense amplifier in accordance with aspects of the present disclosure.

FIG. 5 illustrates an example of a timing diagram 500 for memory cell sensing based on precharging an access line using a sense amplifier. In some examples, timing diagram 500 may correspond to the operation of one or more components described above with reference to FIGS. 1, 2, 3, and 4. For example, timing diagram 500 may include discussion of a memory cell 405 as described with reference to FIG. 4 and, which may be an example of memory cell 105 as described with reference to FIG. 3; an access line 410, which may be an example of or coupled (e.g., selectively with) a digit line 210 as described with reference to FIG. 3; and a sense amplifier 420. The discussion of FIG. 5 may also include an output 425 of the sense amplifier 420, a first input 422, and a second input 424. The first input 422 may be coupled to the switch 445 and the second input 424 may be coupled to a voltage source. Similarly to FIG. 4, FIG. 5 may also include discussion of the functionality of circuit 400, which may include a capacitor 430, a switch 440, a switch 445, a switch 450 and a latch 460. In some examples, the memory cell 405 may include a transistor (e.g., a switching component) 465, a capacitor 470, and a voltage source 475.

In some examples of FIG. 5, initially, the plate line (PL) and the unselected access line which may be an example of or selectively coupled with a digit line, may be pulled up to a VMSA voltage, which in one example, may be approximately 1.5 volts. As previously mentioned, the access line may be access line 410 as discussed with reference to FIG. 4. The terms access line and digit line may be used interchangeably herein. The term access line may be an example of or selectively coupled with a digit line herein.

Next, in FIG. 5, PRECH signal 505, which may be a control signal for switch 440, may change state and cause switch 440 to couple the output 425 of the sense amplifier 420 to the first input 422 of the sense amplifier, which may cause the sense amplifier 420 to precharge the selected access line 410 to a first voltage or an initial sensing voltage. In FIG. 5, precharging the access line 410 may be illustrated by the access line 410 voltage value being pulled down from VMSA to a value less than VMSA.

Precharging the access line 410 may be enabled by switching the switch 440 to a second position which may create a sense amplifier feedback loop. The feedback loop is created by coupling the output 425 of the sense amplifier with the first input 422 of the sense amplifier. While switch 440 is closed, the sense amplifier 420 may precharge the access line 410 to a target voltage in addition to the offset voltage that may reside on the sense amplifier 420. As previously discussed with respect to FIG. 4, the target voltage may be applied to a second input 424 of the sense amplifier 420 and the target voltage may be zero in one example. Similarly, the offset voltage may be an inherent or native voltage that is associated with the sense amplifier 420. This offset voltage associated with the sense amplifier 420 may vary from sense amplifier to sense amplifier and may be an inherent result of fabrication processes of the sense amplifier, properties of the Silicon crystal, impurities introduced in the growth processes of the Silicon crystal, the Silicon ingot itself, or any combination thereof, and so forth. Precharging the access line 410 may increase the accuracy of the sense operation as described herein.

Subsequent to precharging the access line 410, the precharge signal may be disabled by switching the precharge switch 440 to the first position by reverting the state of PRECH signal 505. In disabling the precharge signal, the sense amplifier feedback loop may be disabled due to the sense amplifier output 425 being decoupled from the first input 422 of the sense amplifier.

Subsequent to disabling the precharge signal, word line 465 may be enabled so that the memory cell 405 may charge share with the access line 410 or the access line capacitance. Charge may be transferred between the access line 410 and the memory cell 405 which may transition the access line to a second voltage. The second voltage on the access line may be based at least in part on transferring the charge between the access line and the memory cell. This may be depicted in FIG. 5 as two different voltage levels on the access or digit line. Even though the access line illustrates two voltages at approximately the same time, this is for illustrative purposes and may depend on sensing the memory cell status. The higher voltage level on the access line may be illustrative of the memory cell state being equivalent to a high or one value and the lower voltage level on the access line may be illustrative of the memory cell state being equivalent to a low or a zero value. Further, the voltage levels in FIG. 5 are not to scale and are for illustrative purposes only. In one example, the difference between the two voltage levels on the access line may be approximately hundreds of millivolts, such as a first value of 100 mV and the second value may be 200 mV. Additionally, the latch_en device 472 of latch 460 of FIG. 4 or latch_en signal 525 of FIG. 5 may be activated once the access line 410 starts charge sharing with the memory cell 405.

After opening switch 440, the RefApply signal 510 may change state so as to the change the state of switch 450, and the capacitor 430 may charge share with the access line 410. In some cases, the capacitor may place charge onto the selected access line 410 to raise the voltage of the access line 410, and in other cases the capacitor may accept charge from the access line 410 to lower the voltage of the access line. In the example of FIG. 5, charge may be transferred from the access line 410 to the capacitor 430, which may lower the voltage of the access line 410. The charge transferring between the access line and the capacitor may transition to a third voltage, which may be based at least in part on transferring the charge between the access line and the capacitor. As discussed with respect to FIG. 4, switch 450 may be in a second position which may charge the capacitor 430. This may be the second charge sharing operation of FIG. 5. In one example, the charge sharing between the memory cell 405 and the access line 410 may be implemented first and the charge sharing between the access line 410 and the capacitor 430 may be implemented subsequent to the memory cell and access line charge sharing. In another example, the charge sharing between the capacitor 430 and the access line 410 may be implemented while the memory cell 405 is charge sharing with the access line 410, so that the two charge sharing operations may overlap one another in time.

As depicted in FIG. 5, the voltage levels on the access line 410 may both shift downward during the charge sharing between the access line 410 and the capacitor 430. The high voltage level and the low voltage level of the access line 410 may be pulled downward and may be approximately centered around the sum of the target voltage and the offset voltage that precharged the access line 410. The two voltage levels being pulled down may be based at least in part on the access line having been previously precharged by the sense amplifier 420 and thus may inherently reflect the offset voltage, which may inherently compensate for (e.g., cancel the effect of) the offset voltage. Additionally, the pre-set device 463 of FIG. 4 in the latch 460 and pre-set signal 520 of FIG. 5, may be deactivated approximately when the RefApply signal 510 is triggered. Last the strobe signal 515 and the ProgCompletion signal 530 may be triggered. The ProgCompletion signal 530 may change switch 476 of FIG. 4 to a closed position, which may discharge the reference charge on capacitor 430, and the strobe signal 515 may activate device 480 of the latch 460.

Figure 6:
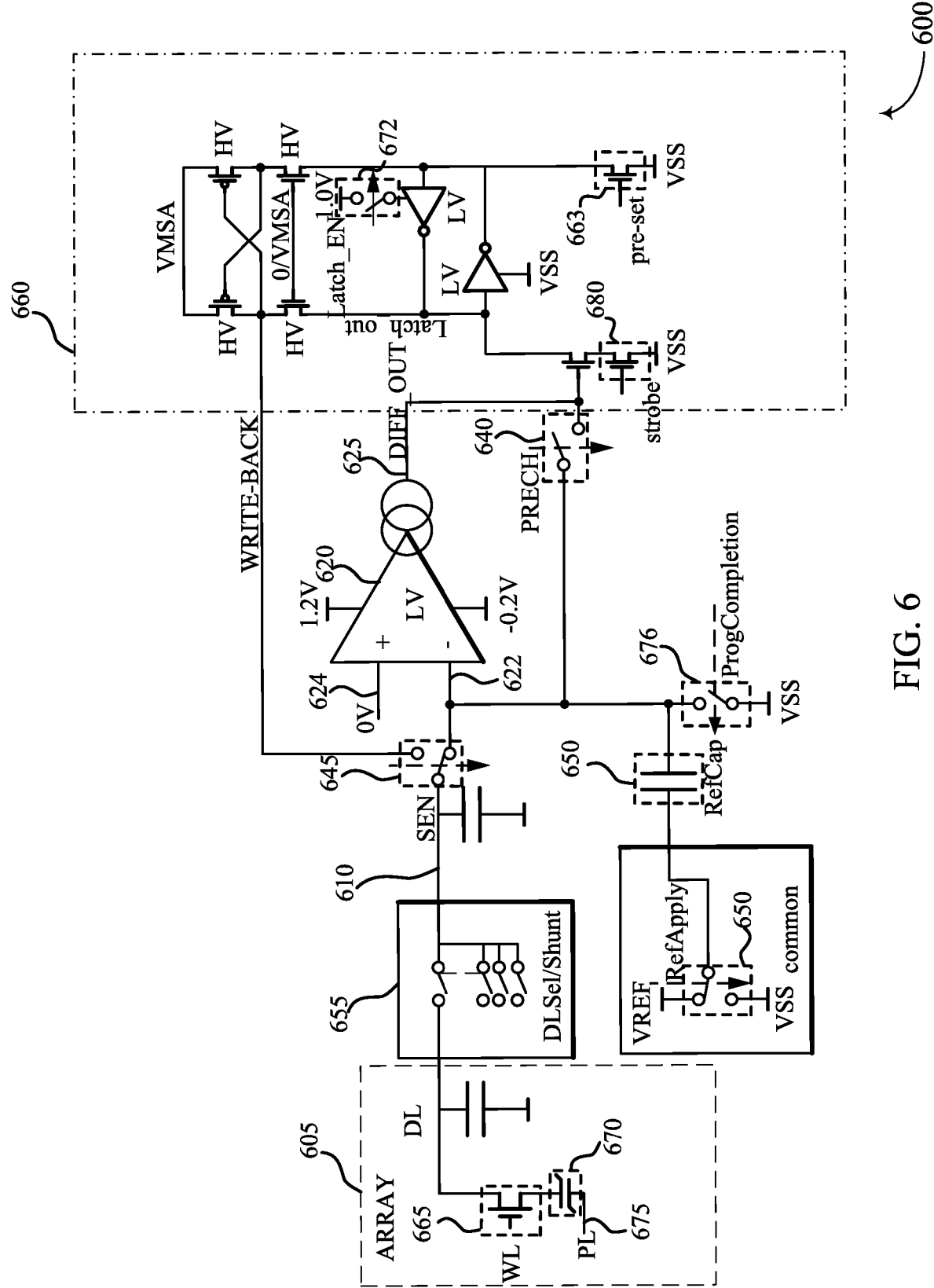
FIG. 6 illustrates an example of a circuit that supports memory cell sensing based on precharging an access line using a sense amplifier in accordance with aspects of the present disclosure.

FIG. 6 illustrates an example of a circuit 600 for memory cell sensing based on precharging an access line using a sense amplifier. In some examples, circuit 600 may include one or more components described above with reference to FIG. 4. For example, and as discussed with respect to circuit 400 of FIG. 4, circuit 600 may include a memory cell 605, which may be an example of memory cell 405 as described with reference to FIG. 4; an access line 610, which may be an example of or selectively coupled with an access line 410 as described with reference to FIG. 4; and a sense amplifier 620. The sense amplifier 620 may include an output 625, a first input 622, and a second input 624. The first input 622 may be coupled to the switch 645 and the second input 624 may be coupled to a voltage source. Circuit 600 may include a capacitor 630, a switch 640, a switch 645, a switch 650 and a latch 660. In some examples, the memory cell 605 may include a transistor (e.g., a switching component) 665, a capacitor 670, and a voltage source 675.

In FIG. 6, the latch 660 may perform functions similar to the function of latch 460 of FIG. 4. Latch 460 and 660 may be utilized in different circumstances. For example, latch 660 may be configured to using components with lower voltage tolerances relative to those of latch 460.

In one example of FIG. 6 and as previously discussed with respect to FIG. 4, the access line 610 may be precharged to a first voltage. In precharging the access line, switch 640 may be in the second position to couple the sense amplifier output 625 with the sense amplifier first input 622. Additionally, switch 645 may be in the first position to couple the access line 610 with the sense amplifier 620. Generally, precharging may be based at least on coupling the access line 610 with the sense amplifier 620.

In the example of FIG. 6, the sense amplifier 620 may be a differential amplifier. In some examples, the access line 610 may be precharged to the first voltage may be precharged to the first voltage which may be or otherwise reflect an offset voltage (e.g., an inherent or native voltage that is associated with the sense amplifier 620, and which may be an undesired or unpredictable voltage). For example, the first voltage may correspond to a target or desired precharge voltage, but the sense amplifier 620 may have an inherent offset of some voltage, and thus the first voltage to which the access line 610 is precharged may be the target precharge voltage plus/minus the offset voltage. In the example of FIG.

6, the target precharge voltage may be zero V, and thus the first voltage may equal the offset voltage of the sense amplifier 620 (e.g., 0.05V). In other examples, however, the target precharge voltage may be some other voltage (e.g., 1.5V, as in the example of FIG. 8), and thus first voltage may equal the target precharge voltage plus/minus the offset voltage (e.g., 1.55V), which may not equal the offset voltage of the sense amplifier 620.

This offset voltage associated with the sense amplifier 620 may vary from sense amplifier to sense amplifier and may be an inherent result of fabrication processes of the sense amplifier, properties of the Silicon crystal, impurities introduced in the growth processes of the Silicon crystal, the Silicon ingot itself, or any combination thereof, and so forth. The first voltage on the access line 610 may be based on the offset voltage and the voltage on the second input 624. The voltage on the second input 624 may be a target voltage, which in some cases may be approximately zero. Even though, the target voltage on the second input 624 may be set to zero, the sense amplifier 620 may still have an offset voltage associated with it and the offset voltage may precharge the access line 610. In some examples, the first voltage may be based on a gain of the sense amplifier 620. Additionally, the sense amplifier that contributes to the precharging of the access line 610 may also be the sense amplifier that senses the states of the memory cell.

Further in FIG. 6, after the first input 622 of the sense amplifier is decoupled from the output 625 of the sense amplifier, the access line 610 and the memory cell 605 may charge share. The access line 610 may transition from the first voltage to a second voltage at least partially due to the charge sharing between the access line 610 and the memory cell 605. When charge sharing occurs, switch 655 may be in the second position so that the memory cell 405 may be coupled with the access line 610.

Another charge sharing may occur between the access line 610 and the capacitor 630. The access line 610 may transition from the second voltage to a third voltage in this charge sharing operation. Subsequent to the charge sharing between the memory cell 605 and the capacitor 630, the state of the memory cell may be determined based at least in part on amplifying the third voltage by employing the sense amplifier 620. The sense amplifier 620 may be the component that both precharges the access line 610 and also amplifies and senses the state of the memory cell 605. During one or both of the charge sharing operations, the output 625 may be coupled with ground to improve efficiency by reducing the total time of the sensing operation.

Figure 7:
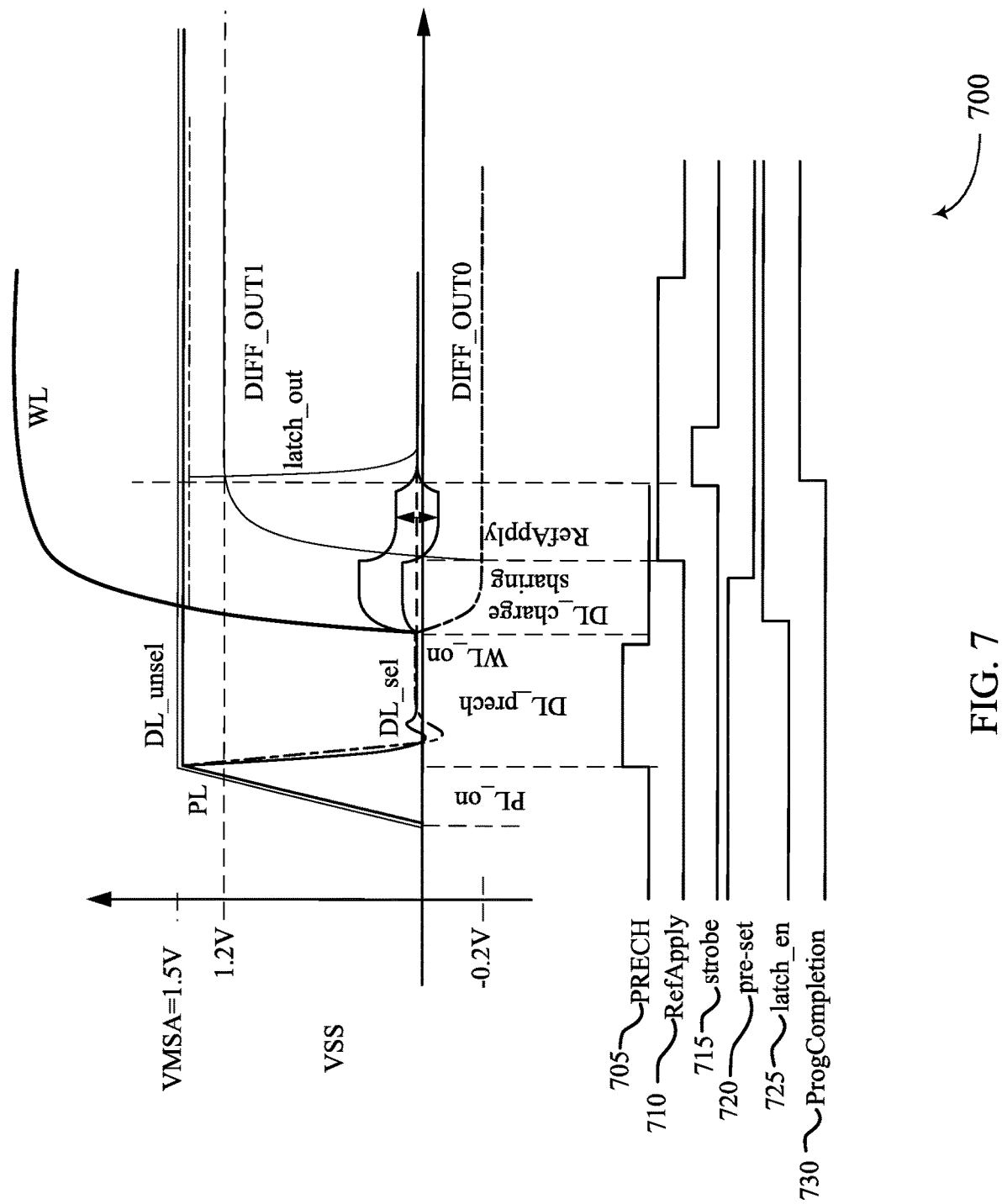
FIG. 7 illustrates an example of a timing diagram that supports memory cell sensing based on precharging an access line using a sense amplifier in accordance with aspects of the present disclosure.

FIG. 7 illustrates an example of a timing diagram 700 for memory cell sensing based on precharging an access line using a sense amplifier. In some examples, timing diagram 700 may correspond to the operation of one or more components described above with reference to FIGS. 4, 5, and 6. For example, timing diagram 700 may include discussion of a memory cell 605 as described with reference to FIG. 6 and, which may be an example of memory cell 105 as described with reference to FIGS. 1 and 2; an access line 610, which may be an example of an access line 610 as described with reference to FIG. 6; and a sense amplifier 620, which may be an example of a sense amplifier 620 as described with reference to FIG. 6.

FIG. 7 illustrates a similar function to FIG. 5. In some examples of FIG. 7, initially, the plate line (PL) and the unselected access line, which may be an example of or selectively coupled with a digit line, may be pulled up to a VMSA voltage, which in one example, may be approximately 1.5 volts. As previously mentioned, the access line may be access line 610 as discussed with reference to FIG. 6.

The subsequent signal sequence in FIG. 7 is similar to FIG. 5, including the charge sharing between the access line 610 and the capacitor 630. As previously discussed in FIG. 5, this second charge sharing operation may pull the voltage levels of the access line 610 down to be approximately centered around the precharge value (the sum of the target voltage and the offset voltage on the sense amplifier 620) on the access line 610.

Figure 8:
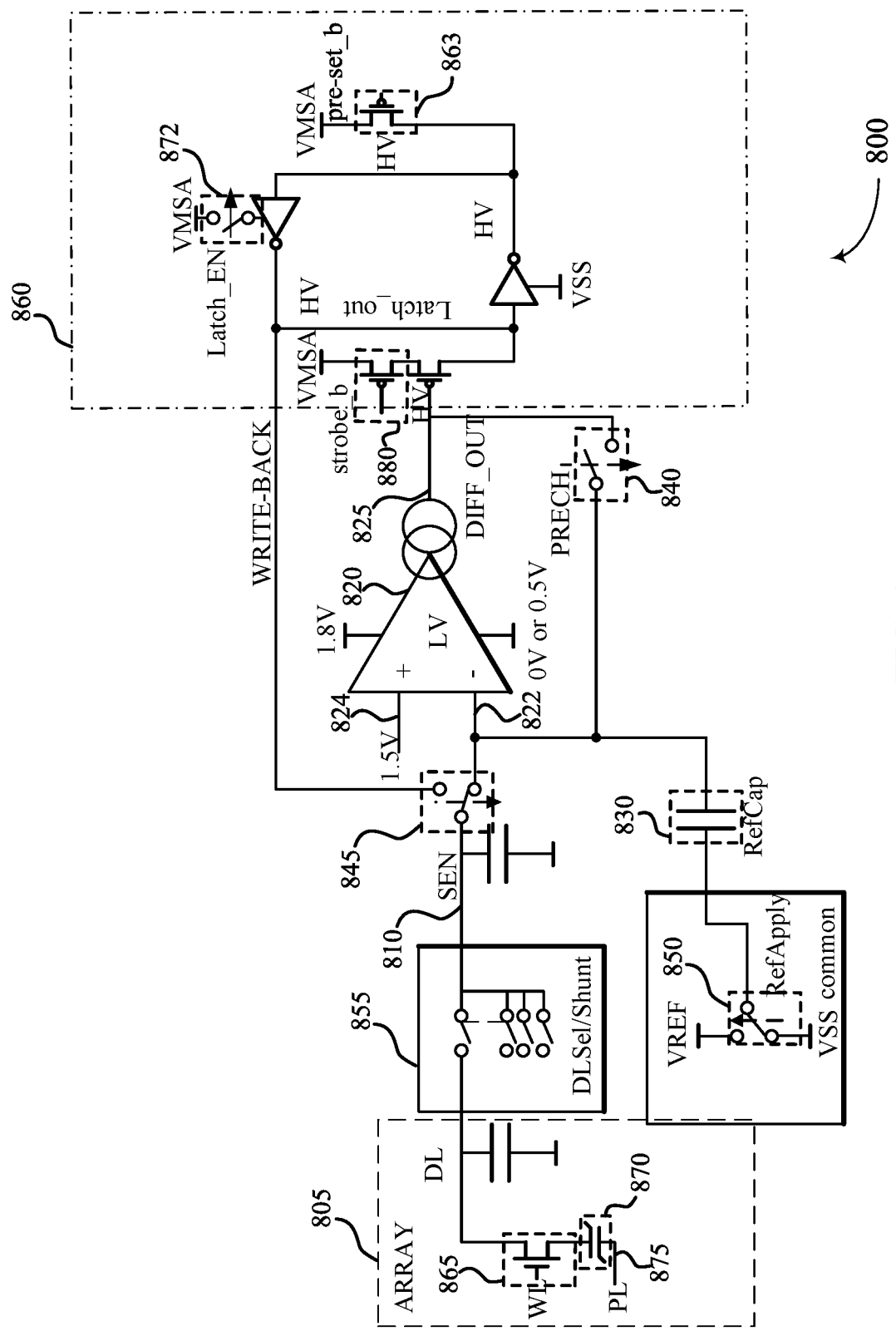
FIG. 8 illustrates an example of a circuit that supports memory cell sensing based on precharging an access line using a sense amplifier in accordance with aspects of the present disclosure.

FIG. 8 illustrates an example of a circuit 800 for memory cell sensing based on precharging an access line using a sense amplifier. In some examples, circuit 800 may include one or more components described above with reference to FIGS. 4 and 6. For example, and as discussed with respect to circuit 400 and 600 of FIGS. 4 and 6 respectively, circuit 800 may include a memory cell 805, which may be an example of memory cell 405 as described with reference to FIG. 4; an access line 810, which may be an example of or selectively coupled with an access line 410 as described with reference to FIG. 4; and a sense amplifier 820. The sense amplifier 820 may include an output 825, a first input 822, and a second input 824. The first input 822 may be coupled to the switch 845 and the second input 824 may be coupled to a voltage source. Circuit 800 may include a capacitor 830, a switch 840, a switch 845, a switch 850 and a latch 860. In some examples, the memory cell 805 may include a transistor (e.g., a switching component) 865, a capacitor 870, and a voltage source 875

FIG. 8 differs from the circuits of FIGS. 4 and 6 due to switch 850. Switch 850 may be in a first position which couples capacitor 830 with ground. Switch 850 may also be in a second position which couples capacitor 830 with a reference voltage, which is the opposite of the function of the respective switches in FIGS. 4 and 6. The difference may result when the capacitor 830 charge shares with the access line 810. The shifting of the voltage levels of the access line 810 will be discussed in more detail below.

Further in FIG. 8, the latch 860 may perform functions similar to the function of latch 460 and 660 of FIGS. 4 and 6 respectively. Latch 460, 660, and 860 may be utilized in different circumstances. For example, latch 860 may be employed to latch voltages centered around a greater voltage than those latched by latches 460, 660.

Figure 9:
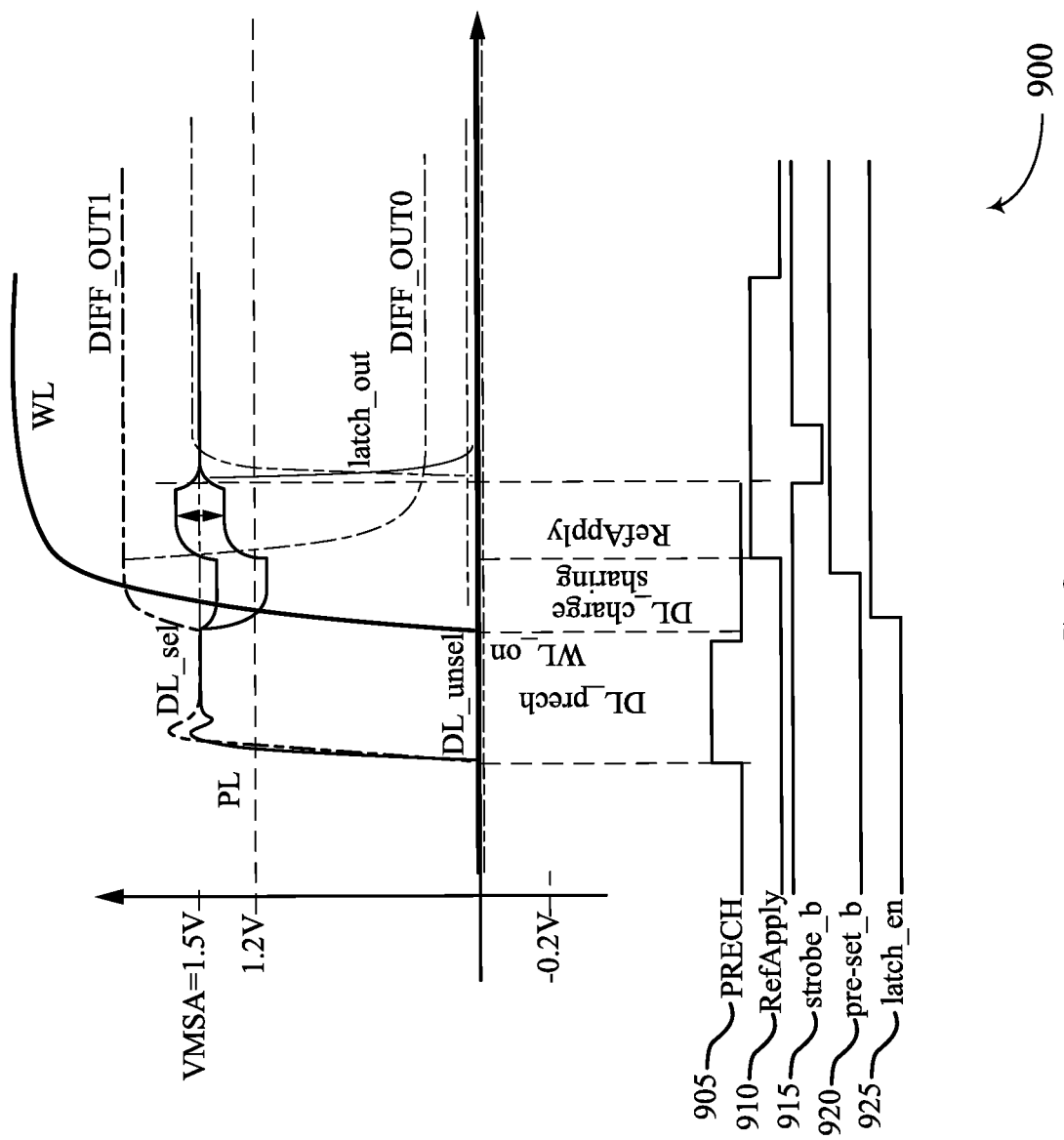
FIG. 9 illustrates an example of a timing diagram that supports memory cell sensing based on precharging an access line using a sense amplifier in accordance with aspects of the present disclosure.

FIG. 9 illustrates an example of a timing diagram 900 for memory cell sensing based on precharging an access line using a sense amplifier. In some examples, timing diagram 900 may correspond to the operation of one or more components described above with reference to FIGS. 4-8. For example, timing diagram 900 may include discussion of a memory cell, an access line, and a sense amplifier. Similar components in different figures may perform similar functions. For example, the memory cell may perform similarly to memory 705 or memory cell 605 as described herein.

FIG. 9 illustrates a similar function to FIGS. 5 and 7. In some examples of FIG. 9, initially, the plate line (PL) and the unselected access line which may be an example of or selectively coupled with a digit line, may be pulled up to a VMSA voltage, which in one example, may be approximately 1.5 volts. The subsequent signal sequence in FIG. 7 is similar to FIG. 5, including the charge sharing between the access line 610 and the capacitor 630. As previously discussed in FIG. 5, this second charge sharing operation may pull the voltage levels of the access line 610 down to be approximately centered around the precharge value (the sum of the target voltage and the offset voltage on the sense amplifier 620) on the access line 610.

Next, in FIG. 9, the PRECH signal 905 may close switch 840, and the sense amplifier 820 may precharge the selected access line 810 to a first voltage or an initial sensing voltage. In FIG. 9, precharging the access line 810 may be illustrated by the access line 810 voltage value being pulled down from VMSA to a value that may be less than VMSA.

Precharging the access line 810 may be enabled by switching the switch 840 to a second position which may create a sense amplifier feedback loop. The feedback loop is created by coupling the output 825 of the sense amplifier with the first input 822 of the sense amplifier. While switch 840 is closed, the sense amplifier 820 may precharge the access line 810 to a target voltage in addition to the offset voltage that may reside on the sense amplifier 820. As previously discussed with respect to FIG. 4, the target voltage may be applied to a second input 824 of the sense amplifier 820 and the target voltage may be zero in one example. Similarly, the offset voltage may be an inherent or native voltage that is associated with the sense amplifier 820. This offset voltage associated with the sense amplifier 420 may vary from sense amplifier to sense amplifier and may be an inherent result of fabrication processes.

Subsequent to precharging the access line 810, the precharge signal may be disabled by switching the precharge switch 840 to the first position. In disabling the precharge signal, the sense amplifier feedback loop may be disabled due to the sense amplifier output 825 being decoupled from the first input 822 of the sense amplifier.

The word line 865 may be enabled so that the memory cell 805 may charge share with the access line 810 or with the access line capacitance. Charge may be transferred between the access line 810 and the memory cell 805 which may transition the access line to a second voltage. The second voltage on the access line may be based at least in part on transferring the charge between the access line and the memory cell. This may be depicted in FIG. 9 as two different voltage levels on the access or digit line. Even though the access line illustrates two voltages at approximately the same time, this is for illustrative purposes and may depend on sensing the memory cell status. The higher voltage level on the access line may be illustrative of the memory cell state being equivalent to a high or one value and the lower voltage level on the access line may be illustrative of the memory cell state being equivalent to a low or a zero value. Further, the voltage levels in FIG. 9 are not to scale and are for illustrative purposes only. In one example, the difference between the two voltage levels on the access line may be approximately hundreds of millivolts, such as a first value of 100 mV and the second value may be 200 mV. Additionally, the latch_en device 872 of latch 860 of FIG. 8 or latch_en signal 925 of FIG. 9 may be activated once the access line 810 starts charge sharing with the memory cell 805.

After precharging, the RefApply signal 910 may change state and thereby change the state of switch 850, and the capacitor 830 may charge share with the access line 810. In some cases, the capacitor may place charge onto the selected access line 410 to raise the voltage of the access line 410, and in other cases the capacitor may accept charge from the access line 410 to lower the voltage of the access line. In the example of FIG. 5, charge may be transferred from the access line 410 to the capacitor 430, which may lower the voltage of the access line 410. The charge transferring between the access line and the capacitor may transition to a third voltage, which may be based at least in part on transferring the charge between the access line and the capacitor. As discussed with respect to FIG. 8, switch 850 may be in a second position which may charge the capacitor 830. This may be the second charge sharing operation of FIG. 9. In one example, the charge sharing between the memory cell 805 and the access line 810 may be implemented first and the charge sharing between the access line 810 and the capacitor 830 may be implemented subsequent to the memory cell and access line charge sharing. In another example, the charge sharing between the capacitor 830 and the access line 810 may be implemented while the memory cell 805 is charge sharing with the access line 810, so that the two charge sharing operations may overlap one another in time.

As depicted in FIG. 9, the voltage levels on the access line 810 may both shift upward during the charge sharing between the access line 810 and the capacitor 830. The high voltage level and the low voltage level of the access line 810 may be pulled upward and may be approximately centered around the sum of the target voltage and the offset voltage that precharged the access line 810. Additionally, the pre-set device 863 of FIG. 8 in the latch 860 and pre-set signal 920 of FIG. 9, may be deactivated approximately when the RefApply signal 910 is triggered. Last the strobe signal 915 may be triggered. The strobe signal 915 may be a result of device 880 of the latch 860 of FIG. 8 being activated.

Figure 10:
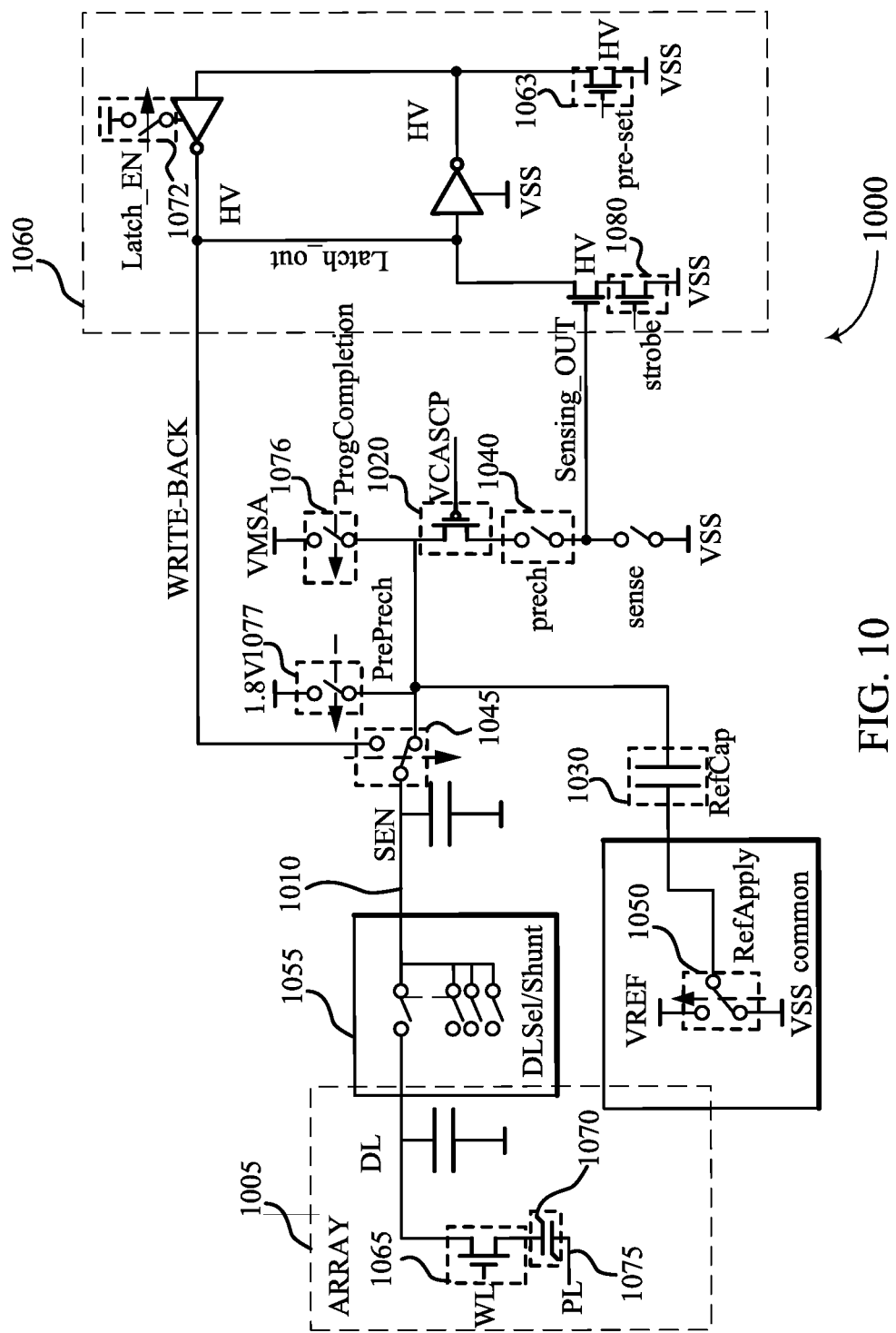
FIG. 10 illustrates an example of a circuit that supports memory cell sensing based on precharging an access line using a sense amplifier in accordance with aspects of the present disclosure.

FIG. 10 illustrates an example of a circuit 1000 for memory cell sensing based on precharging an access line using a sense amplifier. In some examples, circuit 1000 may include one or more components described above with reference to FIGS. 1-9. For example, circuit 1000 may include a memory cell 1005, an access line 1010 and a sense amplifier 1020. These components may perform similar functions to similarly numbered components of previously discussed figures. For example, memory cell 1005 may perform similar functions to memory cell 405, 605, and 805, and so forth. In one example of FIG. 10, the sense amplifier may be a folded cascode amplifier.

Circuit 1000 may include a capacitor 1030, a switch 1040, a switch 1045, a switch 1050 and a latch 1060. In some examples, the memory cell 1005 may include a transistor (e.g., a switching component) 1065, a capacitor 1070, and a voltage source 1075.

In some examples, memory cell 1005 may be indirectly coupled with the sense amplifier 1020. For example, memory cell 1005 may be coupled (e.g., selectively) with access line 1010, which in turn, may be coupled with the sense amplifier 1020 via the switch 1045. The switch 1045 may be in a first position or a second position. The first position of switch 1045 may place the circuit 1000 in a sensing mode and the second position of switch 1045 may place the circuit 1000 in a write-back mode. In write-back mode, the switch 1045 may couple the memory cell 1005 with latch 1060.

Additionally, memory cell 1005 may be coupled with switch 1055 which may select the access line 1010. In one example, the switch 1055 may be one of multiple switches in which switch 1055 is configured to select memory cell 1005. Switch 1055 may be in a first position or a second position. The first position of switch 1055 may decouple the memory cell 1005 from the sense amplifier 1020 and the second position may couple the memory cell 1005 with the sense amplifier 1020, assuming that switch 1045 is also in the first position.

In some examples, capacitor 1030 may be coupled with switch 1050. Switch 1050 may switch between a first position which may be ground and a second position which may be a reference voltage. In this example, switch 1050 is in the second position, and the second position of the switch 1050 which may allow a charge to be placed on capacitor 1030.

In some examples, latch 1060 may vary depending on the desired characteristics of circuit 400. For example, latch 1060 may include fewer components to reduce power and the footprint of the circuit. As discussed herein, latch 1060 may contain more elements or fewer elements, but may not significantly affect some of the functions as discussed with respect to circuit 1000. For example, latch 1060 may not affect the functionality of the access line 1010 being precharged by the sense amplifier 1020, and also may not affect the charge sharing functions between the access line 1010 and the memory cell 1005, or the charge sharing between the capacitor 1030 and the access line 1010.

In FIG. 10 the selected access line 1010 may be initially pre-precharged to a higher level than the VMSA or the target voltage. In one example, the access line 1010 may be pre-precharged to approximately 1.8 volts. This may be achieved with the switch 1077 of FIG. 10, which may be activated to pre-precharge the access line 1010, and with switch 1045 in the first position to couple the access line 1010 with the sense amplifier 1020. Next, in FIG. 10, the access line 1010 may be precharged to a first voltage. Generally, precharging may be based at least on coupling the access line 1010 with the sense amplifier 1020. For example, precharging the access line 1010 may include deactivating switch 1077 so as to decouple the access line 1010 from the pre-precharge voltage source, which may cause the access line 1010 to discharge through the sense amplifier 1020 until a device included in the sense amplifier 1020 reaches cutoff In some cases, the sense amplifier 1020 may comprise a transistor (e.g., a positive metal oxide semiconductor (PMOS) device), and the access line 1010, which may be coupled with the source of the transistor, may discharge through the transistor until the difference between the voltage of the access line 1010 is greater than a bias voltage of the gate of the transistor VCASCP by an amount equal to the threshold voltage of the transistor. Thus, the precharge voltage of the access line 1010 may reflect or otherwise be based on any offset voltage of the sense amplifier 1020 (e.g., any variation in threshold voltage of the transistor).

In some examples of FIG. 10, the access line 1010 may be precharged to the first voltage which may be an offset voltage, or an inherent or native voltage that is associated with the sense amplifier 1020. This offset voltage associated with the sense amplifier 1020 may vary from sense amplifier to sense amplifier and may be an inherent result of fabrication processes of the sense amplifier, properties of the Silicon crystal, impurities introduced in the growth processes of the Silicon crystal, the Silicon ingot itself, or any combination thereof, and so forth. The first voltage on the access line 1010 may be based on the offset voltage of the sense amplifier 1020. Additionally, the sense amplifier that contributes to the precharging of the access line 1010 may also be the sense amplifier that senses the states of the memory cell.

Further in FIG. 10, the access line 1010 and the memory cell 1005 may charge share. The access line 1010 may transition from the first voltage to a second voltage at least partially due to the charge sharing between the access line 1010 and the memory cell 1005. When charge sharing occurs, switch 1055 may be in the second position so that the memory cell 1005 may be coupled with the access line 1010.

Another charge sharing may occur between the access line 1010 and the capacitor 1030. The access line 1010 may transition from the second voltage to a third voltage in this charge sharing operation. In one example, the capacitor 1030 may be referred to as a reference capacitor. The capacitor 1030 may be coupled with a reference voltage depending on the position of the switch 1050. The switch 1050 may be in a first position which may couple the capacitor 1030 with ground or a second position which may couple the capacitor 1030 with a reference voltage. In this example the switch 1050 is in the second position and the capacitor 1030 is coupled with the reference voltage, the amount of charge stored on capacitor 1030 may be based at least on this reference voltage.

In one example, the charge sharing between the memory cell 1005 and the access line 1010 and the charge sharing between the access line 1010 and the capacitor 1030 may occur during at least partially overlapping time periods. In another example, the charge sharing between the memory cell 1005 and the access line 1010 may take place prior to the charge sharing between the access line 1010 and the capacitor 1030. Subsequent to the charge sharing between the memory cell 1005 and the capacitor 1030, the state of the memory cell may be determined based at least in part on amplifying the third voltage by employing the sense amplifier 1025. The sense amplifier 1020 may be the component that both precharges the access line 1010 and also amplifies and senses the state of the memory cell 1005.

Figure 11:
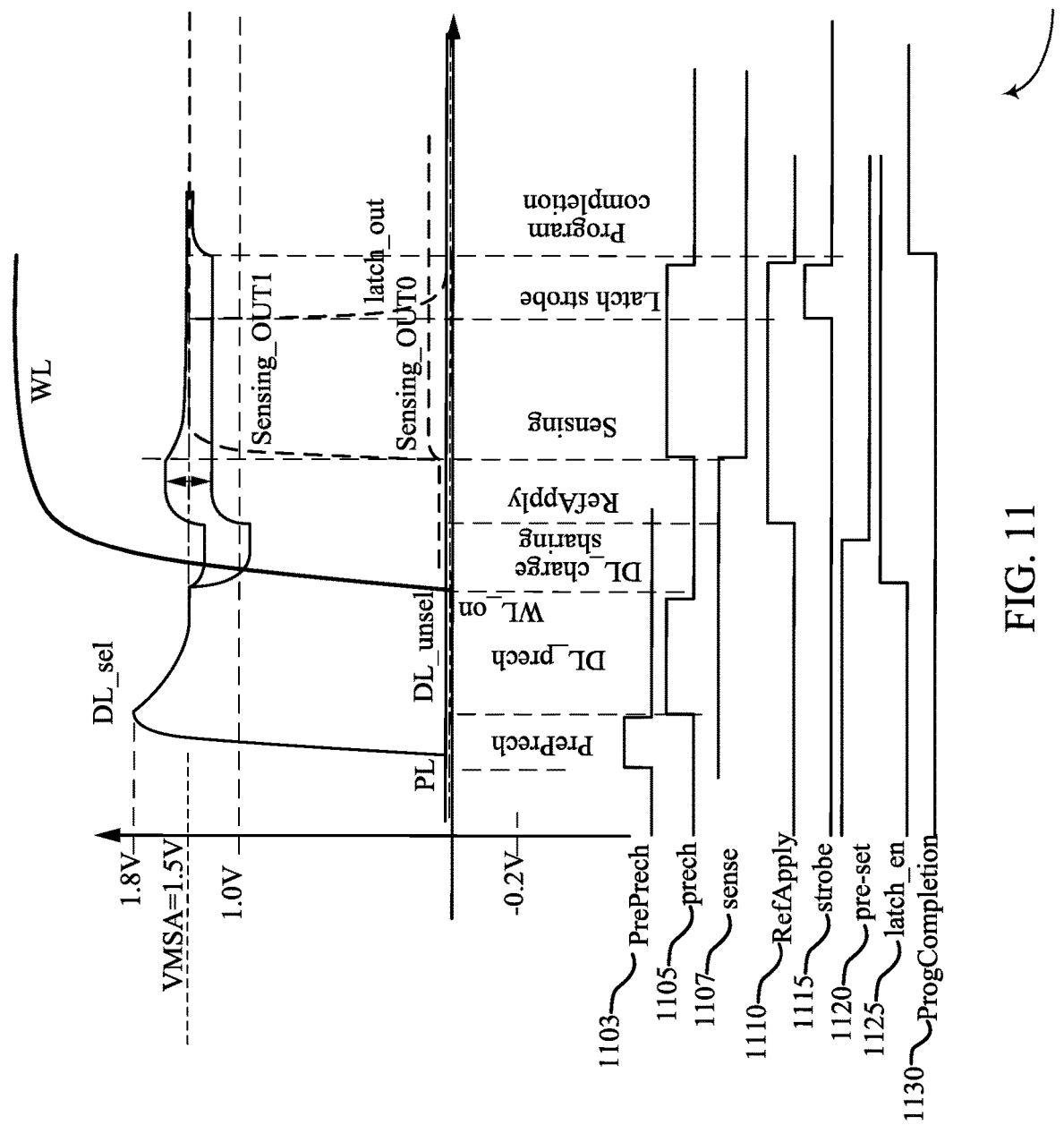
FIG. 11 illustrates an example of a timing diagram that supports memory cell sensing based on precharging an access line using a sense amplifier in accordance with aspects of the present disclosure.

FIG. 11 illustrates an example of a timing diagram 1100 for memory cell sensing based on precharging an access line using a sense amplifier. In some examples, timing diagram 1100 may correspond to the operation of one or more components described above with reference to FIGS. 4-10. For example, timing diagram 1100 may include discussion of a memory cell 1005, an access line 1010, and a sense amplifier 1020 similar to the memory cell 405, access line 410, and sense amplifier 1020. Similarly numbered components in different figures may perform similar functions. For example, memory cell 1005 may perform similar functions to memory cell 805 or memory cell 405 as previously described.

When PrePrech signal 1103 causes switch 1077 to close, the selected access line 1010 may be initially pre-precharged to a higher level than the VMSA or target voltage. In one example, the access line 1010 may be precharged to approximately 1.8 volts.

PrePrech signal 1103 may cause switch 1077 to open and prech signal 1105 may cause switch 1040 to close, which may cause the access line 1010 to precharge by discharging through sense amplifier 1020 until sense amplifier 1020 reaches cutoff, which may depend on an offset voltage (e.g., the threshold voltage of sense amplifier 1020). In one example, the sense amplifier 1020 may be or include a PMOS transistor included in a folded cascode configuration.

Next, the word line 1065 may be enabled so that the memory cell 1005 may charge share with the access line 1010 or with the access line capacitance. Charge may be transferred between the access line 1010 and the memory cell 1005 which may transition the access line to a second voltage. The second voltage on the access line may be based at least in part on transferring the charge between the access line and the memory cell. This may be depicted in FIG. 11 as two different voltage levels on the access or digit line. Even though the access line illustrates two voltages at approximately the same time, this is for illustrative purposes and the voltage levels may depend on two separate sensing functions of the memory cell status. The higher voltage level on the access line may be illustrative of the memory cell state being equivalent to a high or one value and the lower voltage level on the access line may be illustrative of the memory cell state being equivalent to a low or a zero value. Further, the voltage levels in FIG. 11 are not to scale and are for illustrative purposes only. In one example, the difference between the two voltage levels on the access line may be approximately hundreds of millivolts, such as a first value of 100 mV and the second value may be 200 mV. Additionally, the latch_en device 1072 of latch 1060 of FIG. 10 may be activated by the latch_en signal 1125 of FIG. 11 once the access line 1010 starts charge sharing with the memory cell 1005.

The RefApply signal 1110 may change state so as to change the state of switch 1050, and the capacitor 1030 may charge share with the access line 1010. The charge transferring between the access line and the capacitor may transition to a third voltage, which may be based at least in part on transferring the charge between the access line and the capacitor. As discussed with respect to FIG. 10, switch 1050 may be in a second position which may charge the capacitor 1030. This may be the second charge sharing operation of FIG. 11. In one example, the charge sharing between the memory cell 1005 and the access line 1010 may be implemented first and the charge sharing between the access line 1010 and the capacitor 1030 may be implemented subsequent to the memory cell and access line charge sharing. In another example, the charge sharing between the capacitor 1030 and the access line 1010 may be implemented while the memory cell 1005 is charge sharing with the access line 1010, so that the two charge sharing operations may overlap one another in time.

As depicted in FIG. 11, the voltage levels on the access line 1010 may both shift upward during the charge sharing between the access line 1010 and the capacitor 1030. The high voltage level and the low voltage level of the access line 1010 may be pulled upward and may be approximately centered around the sum of the target voltage and the offset voltage that precharged the access line 1010 at prech signal 1105. Additionally, the pre-set device 1063 of FIG. 10 in the latch 1060 and pre-set signal 1120 of FIG. 11, may be deactivated approximately when the RefApply signal 1110 is triggered. The sense amplifier 1020 may be activated which may develop a signal on the sensing node and the state may be latched by latch 1060. The ProgCompletion signal 1135 may change state so as to change switch 1076, which may clamp the source of the sense amplifier 1020 to a fixed voltage, and the strobe signal 1115 may activate device 1080 of the latch 1060.

Figure 12:
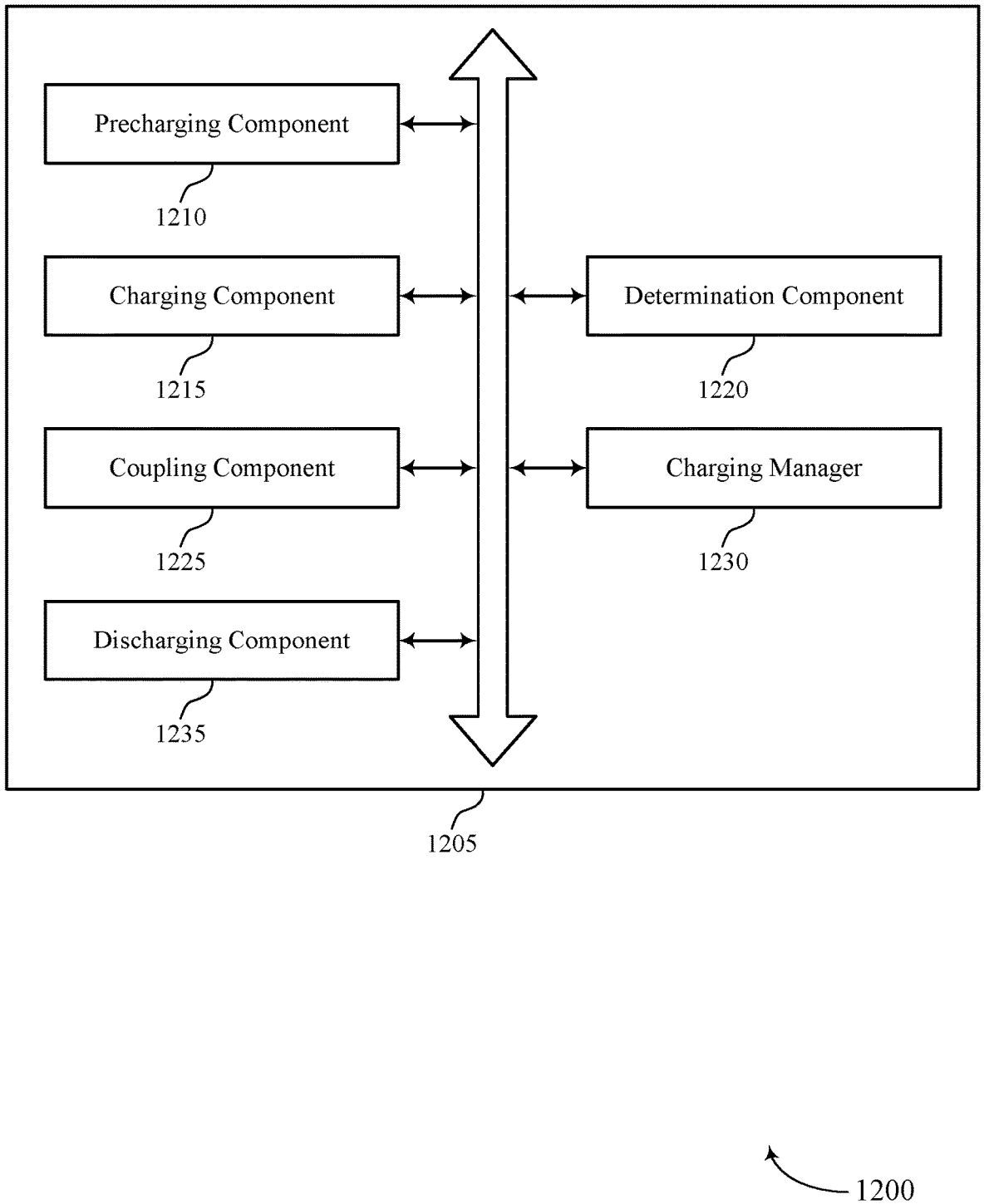
FIG. 12 illustrates a block diagram of a device that supports memory cell sensing based on precharging an access line using a sense amplifier in accordance with aspects of the present disclosure.

FIG. 12 shows a block diagram 1200 of a memory component 1205 that supports memory cell sensing based on precharging an access line using a sense amplifier in accordance with aspects of the present disclosure. The memory component 1205 may be an example of aspects of a memory device as described with reference to FIGS. 1-11. The memory component 1205 may include precharging component 1210, charging component 1215, determination component 1220, coupling component 1225, charging manager 1230, and discharging component 1235. Each of these components may communicate, directly or indirectly, with one another (e.g., via one or more buses).

Precharging component 1210 may cause the memory device to precharge an access line to a first voltage, where the precharging includes coupling the access line with a sense amplifier. As previously discussed, the sense amplifier may both precharge the access line and also sense the state of the memory cell.

Charging component 1215 may cause the memory device to transfer charge between the access line and a memory cell after the precharging, where the access line transitions to a second voltage based on transferring the charge between the access line and the memory cell.

The charging component 1215 may cause the memory device to transfer charge between the access line and a capacitor after the precharging, where the access line transitions to a third voltage based on transferring the charge between the access line and the capacitor.

Determination component 1220 may cause the memory device to determine a state of the memory cell based on amplifying the third voltage using the sense amplifier.

Coupling component 1225 may cause the memory device to couple the access line with an input of the sense amplifier. Additionally, the coupling component 1225 may couple the input of the sense amplifier with an output of the sense amplifier.

Charging manager 1230 may cause the memory device to transfer charge between the access line and a memory cell after the precharging, where the access line transitions to a second voltage based on transferring the charge between the access line and the memory cell. Additionally, the charging manager 1230 may transfer charge between the access line and a capacitor after the precharging, where the access line transitions to a third voltage based on transferring the charge between the access line and the capacitor.

Figure 13:
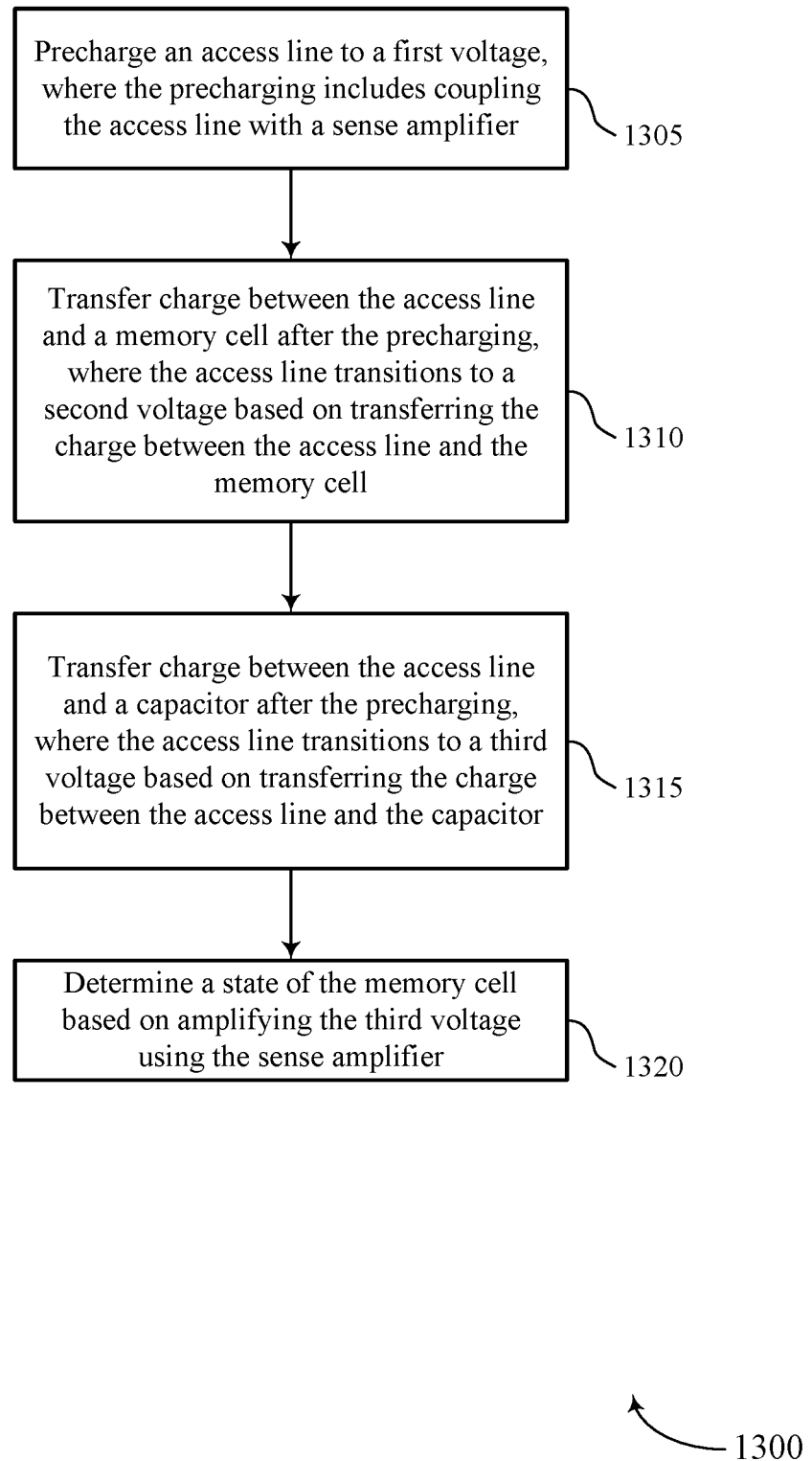
FIGS. 13-15 illustrate flow diagrams that support memory cell sensing based on precharging an access line using a sense amplifier in accordance with aspects of the present disclosure.

FIG. 13 shows a flowchart illustrating a method 1300 that supports memory cell sensing based on precharging an access line using a sense amplifier in accordance with aspects of the present disclosure. The operations of method 1300 may be implemented by a controller or its components as described herein. For example, the operations of method 1300 may be performed by a controller as described with reference to FIGS. 3 through 11. In some examples, a controller may execute a set of instructions to control the functional elements of a memory device to perform the functions described below. Additionally or alternatively, a controller may perform aspects of the functions described below using special-purpose hardware.

At 1305, the controller may cause the memory device to precharge an access line to a first voltage, where the precharging includes coupling the access line with a sense amplifier. The operations of 1305 may be performed according to the methods described herein. In some examples, aspects of the operations of 1305 may be performed by a precharging component as described with reference to FIGS. 4 through 12.

At 1310, the controller may cause the memory device to transfer charge between the access line and a memory cell after the precharging, where the access line transitions to a second voltage based on transferring the charge between the access line and the memory cell. The operations of 1310 may be performed according to the methods described herein. In some examples, aspects of the operations of 1310 may be performed by a charging component as described with reference to FIGS. 4 through 12.

At 1315, the controller may cause the memory device to transfer charge between the access line and a capacitor after the precharging, where the access line transitions to a third voltage based on transferring the charge between the access line and the capacitor. The operations of 1315 may be performed according to the methods described herein. In some examples, aspects of the operations of 1315 may be performed by a charging component as described with reference to FIGS. 4 through 12.

At 1320, the controller may cause the memory device to determine a state of the memory cell based on amplifying the third voltage using the sense amplifier. The operations of 1320 may be performed according to the methods described herein. In some examples, aspects of the operations of 1320 may be performed by a determination component as described with reference to FIGS. 4 through 12.

Figure 14:
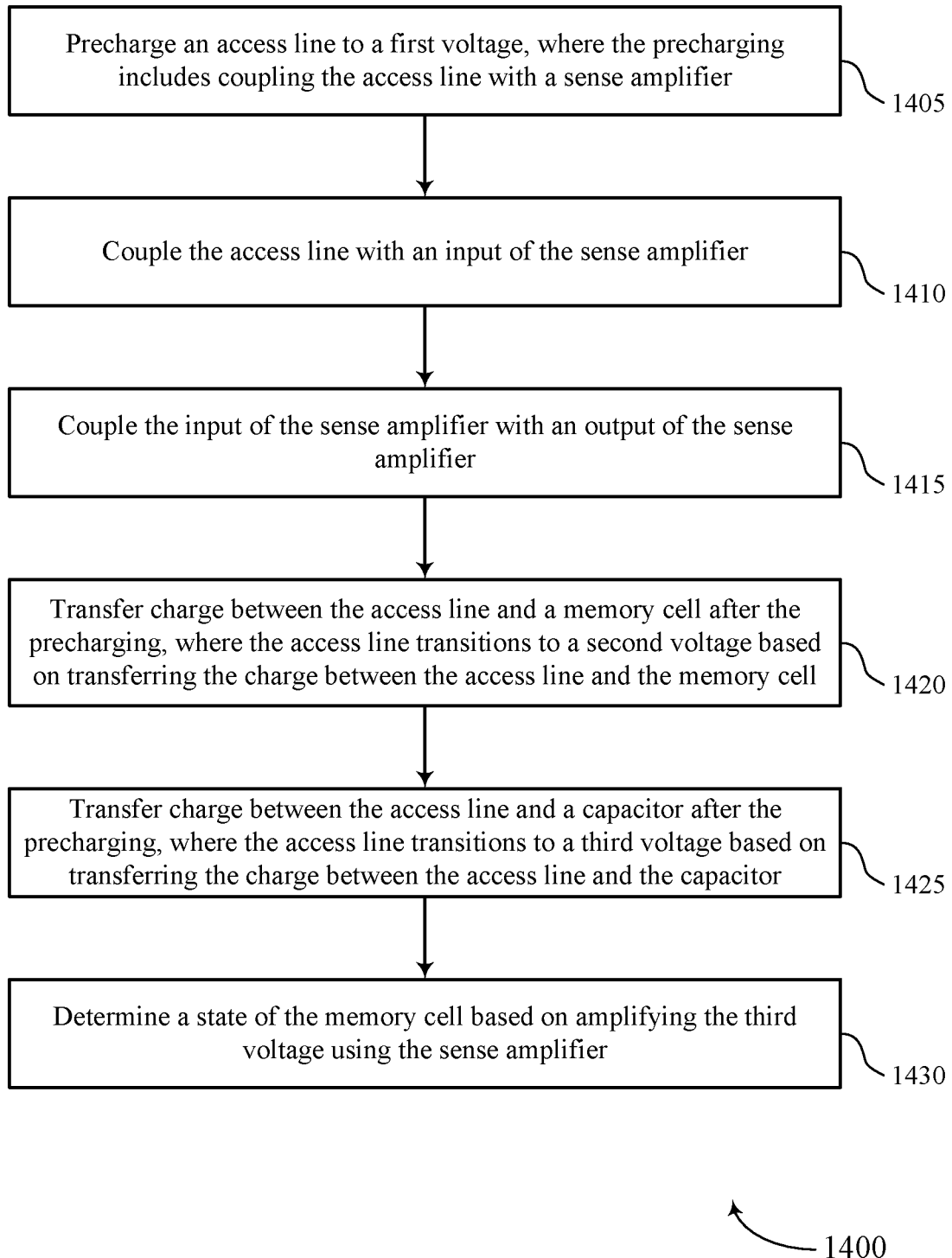

FIG. 14 shows a flowchart illustrating a method 1400 that supports memory cell sensing based on precharging an access line using a sense amplifier in accordance with aspects of the present disclosure. The operations of method 1400 may be implemented by a controller or its components as described herein. For example, the operations of method 1400 may be performed by a controller as described with reference to FIGS. 4 through 12. In some examples, a controller may execute a set of instructions to control the functional elements of a memory device to perform the functions described below. Additionally or alternatively, a controller may perform aspects of the functions described below using special-purpose hardware.

At 1405, the controller may cause the memory device to precharge an access line to a first voltage, where the precharging includes coupling the access line with a sense amplifier. The operations of 1405 may be performed according to the methods described herein. In some examples, aspects of the operations of 1405 may be performed by a precharging component as described with reference to FIGS. 4 through 12.

At 1410, the controller may cause the memory device to couple the access line with an input of the sense amplifier. The operations of 1410 may be performed according to the methods described herein. In some examples, aspects of the operations of 1410 may be performed by a coupling component as described with reference to FIGS. 4 through 12.

At 1415, the controller may cause the memory device to couple the input of the sense amplifier with an output of the sense amplifier. The operations of 1415 may be performed according to the methods described herein. In some examples, aspects of the operations of 1415 may be performed by a coupling component as described with reference to FIGS. 4 through 12.

At 1420, the controller may cause the memory device to transfer charge between the access line and a memory cell after the precharging, where the access line transitions to a second voltage based on transferring the charge between the access line and the memory cell. The operations of 1420 may be performed according to the methods described herein. In some examples, aspects of the operations of 1420 may be performed by a charging component as described with reference to FIGS. 4 through 12.

At 1425, the controller may cause the memory device to transfer charge between the access line and a capacitor after the precharging, where the access line transitions to a third voltage based on transferring the charge between the access line and the capacitor. The operations of 1425 may be performed according to the methods described herein. In some examples, aspects of the operations of 1425 may be performed by a charging component as described with reference to FIGS. 4 through 12.

At 1430, the controller may cause the memory device to determine a state of the memory cell based on amplifying the third voltage using the sense amplifier. The operations of 1430 may be performed according to the methods described herein. In some examples, aspects of the operations of 1430 may be performed by a determination component as described with reference to FIGS. 4 through 12.

Figure 15:
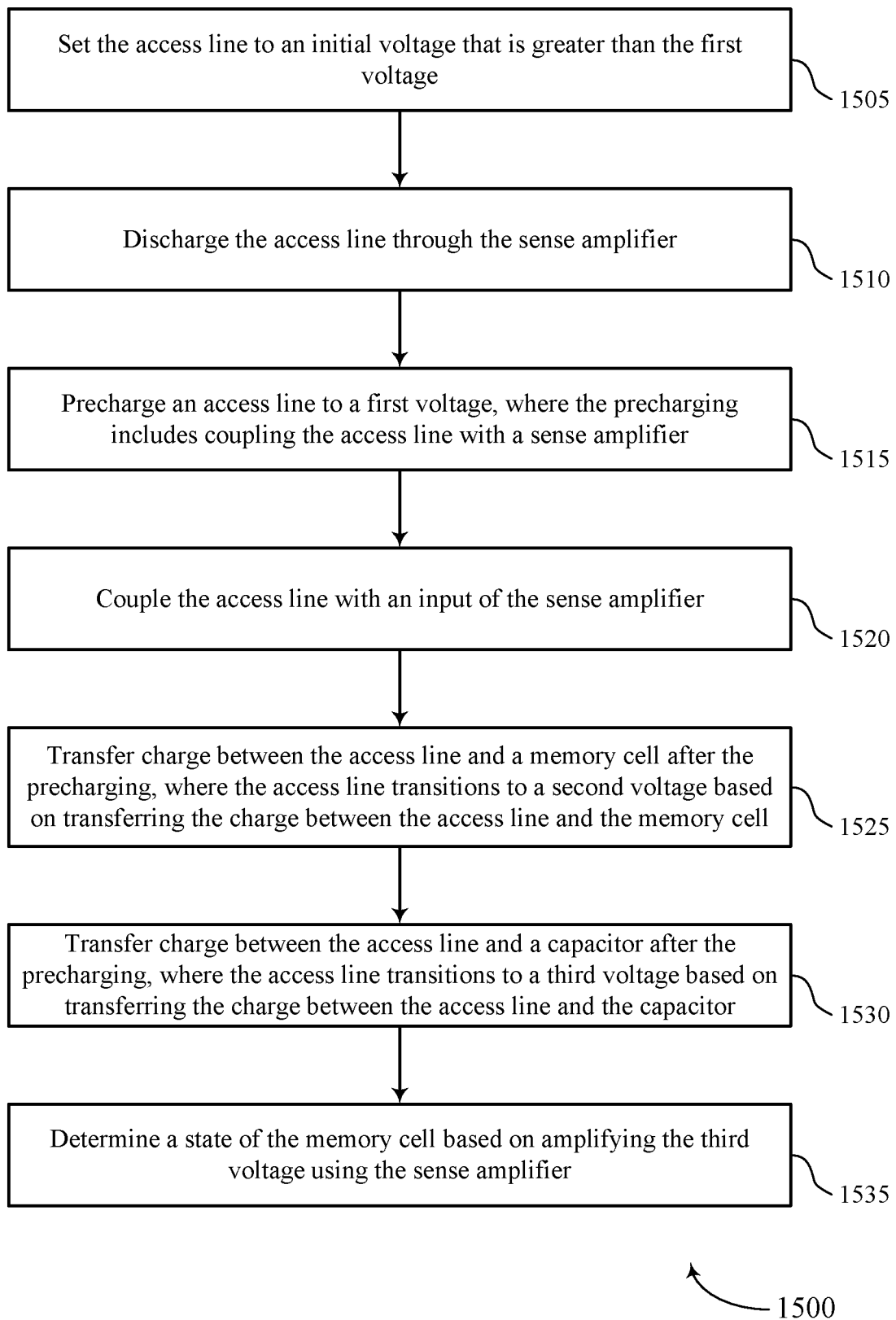

FIG. 15 shows a flowchart illustrating a method 1500 that supports memory cell sensing based on precharging an access line using a sense amplifier in accordance with aspects of the present disclosure. The operations of method 1500 may be implemented by a controller or its components as described herein. For example, the operations of method 1500 may be performed by a controller as described with reference to FIGS. 3 through 11. In some examples, a controller may execute a set of instructions to control the functional elements of a memory device to perform the functions described below. Additionally or alternatively, a controller may perform aspects of the functions described below using special-purpose hardware.

At 1505, the controller may cause the memory device to set the access line to an initial voltage that is greater than the first voltage. The operations of 1505 may be performed according to the methods described herein. In some examples, aspects of the operations of 1505 may be performed by a charging manager as described with reference to FIGS. 4 through 12.

At 1510, the controller may cause the memory device to discharge the access line through the sense amplifier. The operations of 1510 may be performed according to the methods described herein. In some examples, aspects of the operations of 1510 may be performed by a precharging component as described with reference to FIGS. 4 through 12.

At 1515, the controller may cause the memory device to precharge an access line to a first voltage, where the precharging includes coupling the access line with a sense amplifier. The operations of 1515 may be performed according to the methods described herein. In some examples, aspects of the operations of 1515 may be performed by a discharging component as described with reference to FIGS. 4 through 12.

At 1520, the controller may cause the memory device to couple the access line with an input of the sense amplifier. The operations of 1520 may be performed according to the methods described herein. In some examples, aspects of the operations of 1520 may be performed by a coupling component as described with reference to FIGS. 4 through 12.

At 1525, the controller may cause the memory device to transfer charge between the access line and a memory cell after the precharging, where the access line transitions to a second voltage based on transferring the charge between the access line and the memory cell. The operations of 1525 may be performed according to the methods described herein. In some examples, aspects of the operations of 1525 may be performed by a charging component as described with reference to FIGS. 4 through 12.

At 1530, the controller may cause the memory device to transfer charge between the access line and a capacitor after the precharging, where the access line transitions to a third voltage based on transferring the charge between the access line and the capacitor. The operations of 1530 may be performed according to the methods described herein. In some examples, aspects of the operations of 1530 may be performed by a charging component as described with reference to FIGS. 4 through 12.

At 1535, the controller may cause the memory device to determine a state of the memory cell based on amplifying the third voltage using the sense amplifier. The operations of 1535 may be performed according to the methods described herein. In some examples, aspects of the operations of 1535 may be performed by a determination component as described with reference to FIGS. 4 through 12.

In some examples, an apparatus as described herein may perform a method or methods, such as the method 1300, the method 1400, or the method 1500. The apparatus may include features, means, or instructions (e.g., a non-transitory computer-readable medium storing instructions executable by a processor) for precharging an access line to a first voltage, wherein the precharging comprises coupling the access line with a sense amplifier, transferring charge between the access line and a memory cell after the precharging, wherein the access line transitions to a second voltage based at least in part on transferring the charge between the access line and the memory cell, transferring charge between the access line and a capacitor after the precharging, wherein the access line transitions to a third voltage based at least in part on transferring the charge between the access line and the capacitor, and determining a state of the memory cell based at least in part on amplifying the third voltage using the sense amplifier.

In some examples of the methods, apparatuses, and non-transitory computer-readable medium described herein, precharging the access line to the first voltage may include coupling the access line with an input of the sense amplifier.

In some examples of the methods, apparatuses, and non-transitory computer-readable medium described herein, precharging the access line to the first voltage may include coupling the input of the sense amplifier with an output of the sense amplifier.

In some examples of the methods, apparatuses, and non-transitory computer-readable medium described herein, precharging the access line to the first voltage may include setting a second input of the sense amplifier to a target voltage.

In some examples of the methods, apparatuses, and non-transitory computer-readable medium described herein, the first voltage may be based at least in part on the target voltage and an offset voltage of the sense amplifier. In some examples of the methods, apparatuses, and non-transitory computer-readable medium described herein, the first voltage may be based at least in part on a gain of the sense amplifier.

Some examples of the methods, apparatuses, and non-transitory computer-readable medium described herein may further include operations, features, means, or instructions for decoupling, before transferring the charge between the access line and the memory cell, the input of the sense amplifier from the output of the amplifier.

In some examples of the methods, apparatuses, and non-transitory computer-readable medium described herein, precharging the access line to the first voltage may include setting the access line to an initial voltage that is greater than the first voltage and discharging the access line through the sense amplifier.

In some examples of the methods, apparatuses, and non-transitory computer-readable medium described herein, the first voltage is based at least in part on a threshold voltage of the sense amplifier.

In some examples of the methods, apparatuses, and non-transitory computer-readable medium described herein, discharging the access line through the sense amplifier may further include coupling an output of the sense amplifier to a voltage source having a voltage that is less than the first voltage. This may further include decoupling, before transferring the charge between the access line and the memory cell, the output of the sense amplifier from the voltage source.

In some examples of the methods, apparatuses, and non-transitory computer-readable medium described herein, transferring the charge between the access line and the memory may be concurrent with transferring the charge between the access line and the capacitor.

In some examples of the methods, apparatuses, and non-transitory computer-readable medium described herein, transferring the charge between the access line and the capacitor may include coupling the capacitor with a fourth voltage, wherein the amount of charge stored by the capacitor is based at least in part on the fourth voltage. In some examples of the methods, apparatuses, and non-transitory computer-readable medium described herein, the fourth voltage may be a ground reference.

In some examples of the methods, apparatuses, and non-transitory computer-readable medium described herein, the third voltage has a first value when the state of the memory cell is a first state, the third voltage has a second value when the state of the memory cell comprises second state, and the first value is greater than and the second value is less than a center voltage, the center voltage based at least in part on an offset voltage of the sense amplifier.

Some examples of the methods, apparatuses, and non-transitory computer-readable medium described herein may further include operations, features, means, or instructions for coupling, concurrent with at least one of transferring the charge between the access line and the memory cell or transferring the charge between the access line and the capacitor, an output of the amplifier with a voltage source.

In some examples of the methods, apparatuses, and non-transitory computer-readable medium described herein, the sense amplifier may be a differential amplifier or a folded cascode amplifier.

In some examples, an apparatus may perform aspects of the functions described herein using general- or special-purpose hardware. The apparatus may include a memory cell configured to charge share with an access line, a sense amplifier having an output node and an input node that is configured to be selectively coupled with the access line, a capacitor configured to charge share with the access line, and a latch configured to latch a state of the memory cell based at least in part on a voltage at the output node of the sense amplifier.

In some examples, the apparatus may include the sense amplifier which may be a differential amplifier configured to drive the access line to a first voltage when the input node and the output node are coupled with the access line, and wherein the first voltage is based at least in part on a second voltage at a second input node of the differential amplifier. Additionally, coupling the input node and the output node with the access line may form a feedback loop.

In some examples, the apparatus may include a single-ended amplifier configured to discharge the access line to a first voltage when the input node may be coupled with the access line and the output node may be coupled with a voltage source, and wherein the first voltage may be based at least in part on a threshold voltage of a transistor included in the single-ended amplifier.

In some examples, the apparatus may include a switching component configured to set the access line to an initial voltage that is greater than the first voltage. Additionally, the apparatus may include a switching component configured to selectively couple the capacitor with a voltage source, wherein a direction of charge transfer between the capacitor and the access line is based at least in part on the voltage source.

In some examples of the apparatus, the output node may be configured to be coupled with the access line at a first time and to be decoupled from the access line at a second time that is after the first time, the memory cell may be configured to be coupled with the access line at a third time that is after the second time, and the capacitor is configured to charge share with the access line at a fourth time that is after the second time, and the latch is configured to latch the state of the memory cell at a fifth time that is after the fourth time.

In some examples, the apparatus may include a memory cell, a sense amplifier, a capacitor, and a memory controller. The memory controller may be operable to precharge an access line to a first voltage based at least in part on coupling the access line with an input node of the sense amplifier, cause the memory cell to charge share with the access line after precharging the access line, wherein the access line transitions to a second voltage based at least in part on exchanging charge with the memory cell, cause the access line to charge share with the capacitor after precharging the access line, wherein the access line transitions to a third voltage based at least in part on exchanging charge with the capacitor, and determine a state of the memory cell based at least in part on amplifying the third voltage using the sense amplifier.

It should be noted that the methods described above describe possible implementations, and that the operations and the steps may be rearranged or otherwise modified and that other implementations are possible. Further, aspects from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly coupled with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

As used herein, the term "substantially" means that the modified characteristic (e.g., a verb or adjective modified by the term substantially) need not be absolute but is close enough to achieve the advantages of the characteristic.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are signals), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a digital signal processor (DSP), an application specific integrated circuit (ASIC), a field-programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
    setting a first switching component to a first state to precharge an access line to a first voltage using a sense amplifier;
    setting the first switching component to a second state to terminate precharging the access line;
    enabling a word line to couple the access line with a memory cell, wherein the access line transitions to a second voltage based at least in part on coupling the access line with the memory cell; and
    setting a second switching component to a first state to couple a capacitor with a reference voltage, wherein the access line transitions to a third voltage based at least in part on coupling the capacitor with the reference voltage.

2. The method of claim 1, further comprising:
    activating the sense amplifier to amplify the third voltage; and
    determining a state of the memory cell based at least in part on amplifying the third voltage.

3. The method of claim 1, wherein precharging the access line to the first voltage comprises:
    enabling a sense amplifier feedback loop by coupling an input of the sense amplifier with an output of the sense amplifier, wherein the access line is coupled with the input of the sense amplifier.

4. The method of claim 3, wherein the first voltage is based at least in part on a target voltage on a second input of the sense amplifier and an offset voltage of the sense amplifier.

5. The method of claim 1, wherein precharging the access line to the first voltage comprises:
    coupling an output of the sense amplifier with a voltage source.

6. The method of claim 5, further comprising:
    setting the access line to an initial voltage that is greater than the first voltage before setting the first switching component to the first state; and
    discharging the access line through the sense amplifier after setting the first switching component to the first state.

7. The method of claim 5, wherein the first voltage is based at least in part on a threshold voltage of the sense amplifier.

8. The method of claim 1, wherein the word line is enabled concurrent with setting the second switching component to the first state.

9. The method of claim 1, further comprising:
    setting one or more third switching components to a first state to couple the access line with the memory cell, wherein the access line transitions to the second voltage based at least in part on coupling the access line with the memory cell using the one or more third switching components.

10. The method of claim 1, wherein the sense amplifier comprises a differential amplifier.

11. The method of claim 1, wherein the sense amplifier comprises a folded cascode amplifier.

12. An apparatus, comprising:
a memory cell;
an access line selectively couplable with the memory cell;
a sense amplifier selectively couplable with the access line;
a capacitor coupled with the sense amplifier;
a first switching component configured to enable the sense amplifier to precharge the access line to a first voltage and to disable precharging the access line;
a word line configured to transition the access line to a second voltage by selectively coupling the access line with the memory cell; and
a second switching component configured to selectively couple the capacitor to a reference voltage to transition the access line to a third voltage.

13. The apparatus of claim 12, further comprising:
a latch configured to latch a state of the memory cell based at least in part on the third voltage.

14. The apparatus of claim 12, wherein the sense amplifier comprises:
a differential amplifier configured to drive the access line to the first voltage when an input node and an output node of the differential amplifier are coupled with the access line to form a feedback loop, and wherein the first voltage is based at least in part on a voltage applied to a second input node of the differential amplifier.

15. The apparatus of claim 12, wherein the sense amplifier comprises:
a single-ended amplifier configured to discharge the access line to the first voltage when an input node of the single-ended amplifier is coupled with the access line and an output node of the single-ended amplifier is coupled with a voltage source, and wherein the first voltage is based at least in part on a threshold voltage of a transistor of the single-ended amplifier.

16. The apparatus of claim 15, further comprising:
a third switching component configured to set the access line to a voltage that is greater than the first voltage.

17. The apparatus of claim 12, wherein the second switching component is configured to selectively couple the capacitor to a second reference voltage.

18. The apparatus of claim 17, wherein one of the reference voltage or the second reference voltage is a ground reference.

19. The apparatus of claim 12, further comprising:
one or more third switching components configured to selectively couple the access line with the memory cell, wherein the access line transitions to the second voltage based at least in part on coupling the access line with the memory cell using the one or more third switching components.

20. An apparatus, comprising:
a memory cell;
a sense amplifier;
a capacitor; and
a memory controller operable to:
precharge an access line to a first voltage using the sense amplifier based at least in part on setting a first switching component to a first state;
set the first switching component to a second state to terminate precharging the access line;
transition the access line to a second voltage based at least in part on enabling a word line to couple the access line with the memory cell;
transition the access line to a third voltage based at least in part on setting a second switching component to a first state to couple the capacitor with a reference voltage;
amplify the third voltage based at least in part on activating the sense amplifier; and
determine a state of the memory cell based at least in part on amplifying the third voltage.

* * * * *